(12) United States Patent
Emerson et al.

(10) Patent No.: US 10,436,829 B2
(45) Date of Patent: Oct. 8, 2019

(54) APPARATUS FOR MEASURING CONDITION OF ELECTROPLATING CELL COMPONENTS AND ASSOCIATED METHODS

(71) Applicant: Lam Research Corporation, Fremont, CA (US)

(72) Inventors: Mark E. Emerson, Newberg, OR (US); Steven T. Mayer, Aurora, OR (US); Lawrence Ossowski, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 91 days.

(21) Appl. No.: 15/490,503

(22) Filed: Apr. 18, 2017

(65) Prior Publication Data

US 2017/0307554 A1 Oct. 26, 2017

Related U.S. Application Data

(60) Provisional application No. 62/325,237, filed on Apr. 20, 2016.

(51) Int. Cl.
*G01N 27/04* (2006.01)
*G01R 31/26* (2014.01)
(Continued)

(52) U.S. Cl.
CPC ........... *G01R 31/00* (2013.01); *C25D 17/001* (2013.01); *C25D 17/005* (2013.01); *C25D 17/06* (2013.01);
(Continued)

(58) Field of Classification Search
CPC ........ G01R 31/00; G01R 31/44; C25D 17/00; H01L 22/14
See application file for complete search history.

(56) References Cited

U.S. PATENT DOCUMENTS 7,198,962 B2\* 4/2007 Kohno ..................... G01R 3/00
438/14
2003/0137030 A1 7/2003 Lunde
(Continued)

FOREIGN PATENT DOCUMENTS

CN 1502126 A 6/2004
CN 101329663 A 12/2008
(Continued)

*Primary Examiner* — Huy Q Phan
*Assistant Examiner* — Zannatul Ferdous
(74) *Attorney, Agent, or Firm* — Penilla IP, APC

(57) ABSTRACT

A device for measuring electrical properties of electrical contacts within an electroplating apparatus has a disc-shaped structure like that of a wafer. Multiple conductive pads are formed to collectively circumscribe an outer periphery of the disc-shaped structure. Adjacently positioned ones of the conductive pads are electrically isolated from each other. The device includes a current source that supplies electric current at a first terminal and sinks electric current at a second terminal. The device includes measurement circuitry, having first and second input terminals, that determines a value of an electrical parameter based on signals present at the first and second input terminals. The device includes switching circuitry for connecting selected ones of the conductive pads to the first and second terminals of the current source and to the first and second input terminals of the measurement circuitry at a given time. The device also includes an onboard power supply.

29 Claims, 11 Drawing Sheets

(51) Int. Cl.
  *G01R 31/28* (2006.01)
  *G01R 31/00* (2006.01)
  *G01R 31/44* (2006.01)
  *C25D 17/00* (2006.01)
  *C25D 17/06* (2006.01)
  *C25D 21/12* (2006.01)
  *H01L 21/66* (2006.01)
(52) U.S. Cl.
  CPC ............ *C25D 21/12* (2013.01); *G01R 31/44* (2013.01); *H01L 22/14* (2013.01)

(56) References Cited

U.S. PATENT DOCUMENTS

| | | | |
|---|---|---|---|
| 2004/0098216 A1* | 5/2004 | Ye | G01D 9/005 |
| | | | 702/127 |
| 2005/0085032 A1* | 4/2005 | Aghababazadeh | ............ |
| | | | G01R 31/2831 |
| | | | 438/232 |
| 2007/0046284 A1* | 3/2007 | Renken | H01L 21/67253 |
| | | | 702/58 |
| 2011/0102053 A1* | 5/2011 | Wang | G01R 31/3172 |
| | | | 327/365 |
| 2011/0278054 A1* | 11/2011 | Lee | H05K 1/111 |
| | | | 174/260 |

FOREIGN PATENT DOCUMENTS

| | | |
|---|---|---|
| CN | 101740544 A | 6/2010 |
| CN | 101996955 A | 3/2011 |
| CN | 102034683 A | 4/2011 |
| CN | 102244047 A | 11/2011 |
| CN | 204031589 U | 12/2014 |

* cited by examiner

View A-A

View B-B

APPARATUS FOR MEASURING CONDITION OF ELECTROPLATING CELL COMPONENTS AND ASSOCIATED METHODS

CLAIM OF PRIORITY

This application claims priority under 35 U.S.C. 119(e) to U.S. Provisional Patent Application No. 62/325,237, filed Apr. 20, 2016, the disclosure of which is incorporated herein by reference in its entirety for all purposes.

BACKGROUND

1. Field of the Invention

The present invention relates to semiconductor device fabrication.

2. Description of the Related Art

Some semiconductor device fabrication processes include electroplating of a material onto a semiconductor wafer ("wafer" hereafter). The electroplating can be done in an electroplating cell in which the wafer, with an electrically conductive seed layer present thereon, is positioned to physically contact multiple electrical contacts positioned around a perimeter of the wafer. Also, in some configurations, when the wafer is positioned to physically contact the multiple electrical contacts, the wafer may also be positioned such that a peripheral portion of the wafer is made to physically contact a lip seal member to prevent as much as possible an electroplating solution from reaching the multiple electrical contacts. In such configurations, the seal between the wafer and the lip seal member may not be perfect and may degrade over multiple electroplating cycles, thereby adversely allowing some amount of electroplating solution to reach some of the electrical contacts.

Electric current is directed through the multiple electrical contacts in a controlled manner to electrify the seed layer present on the wafer and thereby induce reactions which result in electroplating of a material on the wafer. With an increased number of electroplating cycles, plating material may build up on some of the electrical contacts and/or on the lip seal member and cause a change in the electrical resistance along one or more electrical conduction paths extending to the wafer. A change in the electrical resistance along a given electrical conduction path to the wafer can affect the electroplating results on the wafer. For example, an increased electrical resistance along a given electrical conduction path to the wafer can reduce an amount electric current flow along the given electrical conduction path and cause a local reduction in the amount, e.g., thickness, of electroplated material on the wafer near the physical contact location corresponding to the given electrical conduction path.

Given the foregoing, it should be appreciated that a need exists to identify which of the multiple electrical contacts and/or which portion of the lip seal member has been subjected to undesirable electroplating to the point where changes in electrical resistance along corresponding electrical conduction path(s) can adversely impact electroplating results on the wafer. It is within this context that the present invention arises.

SUMMARY

In an example embodiment, a device is disclosed for measuring electrical properties of electrical conduction paths within a semiconductor processing apparatus. The semiconductor processing apparatus is configured to electrically connect the electrical conduction paths to a surface of a wafer when performing a process on the wafer. The device includes a disc-shaped structure having an outer diameter substantially equal to an outer diameter of the wafer. The disc-shaped structure has an overall thickness substantially similar to an overall thickness of the wafer. The device includes multiple conductive pads formed along an outer perimeter of a first side of the disc-shaped structure. Adjacently positioned ones of the multiple conductive pads are electrically isolated from each other. The multiple conductive pads collectively circumscribe the outer perimeter of the first side of the disc-shaped structure. The device includes an electrical power source having a first terminal and a second terminal. The electrical power source is configured to supply electrical power through an electrically conductive path extending between the first terminal and the second terminal and through a portion of the semiconductor processing apparatus when the disc-shaped structure is positioned within the semiconductor processing apparatus. The first terminal is electrically connected to a first set of at least one of the multiple conductive pads. The second terminal is electrically connected to a second set of at least one of the multiple conductive pads. The second set of the multiple conductive pads is exclusive of the first set of the multiple conductive pads. The first and second sets of the multiple conductive pads form part of the electrically conductive path extending between the first terminal and the second terminal. The device includes measurement circuitry having a first input terminal and a second input terminal. The first input terminal of the measurement circuitry is electrically connected to a first selected one of the multiple conductive pads. The second input terminal of the measurement circuitry is electrically connected to a second selected one of the multiple conductive pads. The measurement circuitry is configured to determine a value of an electrical parameter based on electrical signals present at the first and second selected ones of the multiple conductive pads. The device also includes a power supply disposed on the disc-shaped structure. The power supply is connected to supply electric power to all electric powered components on the disc-shaped structure.

In an example embodiment, a method is disclosed for measuring electrical properties of electrical conduction paths within a semiconductor processing apparatus. The semiconductor processing apparatus is configured to electrically connect the electrical conduction paths to a surface of a wafer when performing a process on the wafer. The method includes positioning a measurement device within the semiconductor processing apparatus. The measurement device has a disc-shaped structure with an outer diameter substantially equal to an outer diameter of the wafer and with an overall thickness substantially similar to an overall thickness of the wafer. The measurement device is positioned within the semiconductor processing apparatus such that multiple conductive pads formed along an outer perimeter of a first side of the measurement device physically contact electrical contacts within the semiconductor processing apparatus. Adjacently positioned ones of the multiple conductive pads are electrically isolated from each other on the measurement device. The multiple conductive pads collectively circumscribe the outer perimeter of the first side of the measurement device. The method includes operating the measurement device to supply electrical power through an electrically conductive path that includes a first set of at least one of the multiple conductive pads and a second set of at least one of the multiple conductive pads. The second set of the multiple conductive pads is exclusive of the first set of the multiple conductive pads. The method includes operating the measurement device to measure electrical signals present at a first selected one of the multiple conductive pads and at a second selected one of the multiple conductive pads. The method also includes operating the measurement device to determine a characterization parameter for an electrical conduction path extending through a portion of the semiconductor processing apparatus and including the first selected one of the multiple conductive pads and the second selected one of the multiple conductive pads using the measured electrical signals.

In an example embodiment, a system is disclosed for measuring electrical properties of electrical conduction paths within a semiconductor processing apparatus. The semiconductor processing apparatus is configured to electrically connect the electrical conduction paths to a surface of a wafer when performing a process on the wafer. The system includes a measurement device having a disc-shaped structure with an outer diameter substantially equal to an outer diameter of the wafer and with an overall thickness substantially similar to an overall thickness of the wafer. The measurement device includes multiple conductive pads formed along an outer perimeter of a first side of the disc-shaped structure. Adjacently positioned ones of the multiple conductive pads are electrically isolated from each other. The multiple conductive pads collectively circumscribe the outer perimeter of the first side of the disc-shaped structure. The measurement device includes an electrical power source having a first terminal and a second terminal. The electrical power source is configured to supply electrical power through an electrically conductive path extending between the first terminal and the second terminal and through a portion of the semiconductor processing apparatus when the measurement device is positioned within the semiconductor processing apparatus. The first terminal is electrically connected to a first set of at least one of the multiple conductive pads. The second terminal is electrically connected to a second set of at least one of the multiple conductive pads. The second set of the multiple conductive pads is exclusive of the first set of the multiple conductive pads. The first and second sets of the multiple conductive pads form part of the electrically conductive path extending between the first terminal and the second terminal. The measurement device also includes measurement circuitry having a first input terminal and a second input terminal. The first input terminal of the measurement circuitry is electrically connected to a first selected one of the multiple conductive pads. The second input terminal of the measurement circuitry is electrically connected to a second selected one of the multiple conductive pads. The measurement circuitry is configured to determine a value of an electrical parameter based on electrical signals present at the first and second selected ones of the multiple conductive pads. The measurement device includes a communication module configured to communicate data representing the value of the electrical parameter determined by the measurement circuitry. The measurement device also includes a power supply connected to supply electric power to all electric powered components on the measurement device.

In an example embodiment, a method includes positioning a measurement device in a semiconductor processing apparatus in a same manner that a wafer is to be positioned within the semiconductor processing apparatus. The semiconductor processing apparatus is configured to electrically connect one or more electrical conduction paths to a surface of the wafer when performing a process on the wafer. The measurement device has a disc-shaped structure with an outer diameter substantially equal to an outer diameter of the wafer and with an overall thickness substantially similar to an overall thickness of the wafer. The measurement device is positioned within the semiconductor processing apparatus such that multiple conductive pads formed along an outer perimeter of a first side of the measurement device physically contact electrical contacts within the semiconductor processing apparatus. The method also includes operating the measurement device to supply electrical power through an electrically conductive path that includes a first set of at least one of the multiple conductive pads and a second set of at least one of the multiple conductive pads. The second set of the multiple conductive pads is exclusive of the first set of the multiple conductive pads. The method also includes operating the measurement device to measure electrical signals present at a first selected one of the multiple conductive pads and at a second selected one of the multiple conductive pads to determine a characterization parameter for an electrical conduction path extending through a portion of the semiconductor processing apparatus. The method also includes removing the measurement device from semiconductor processing apparatus.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
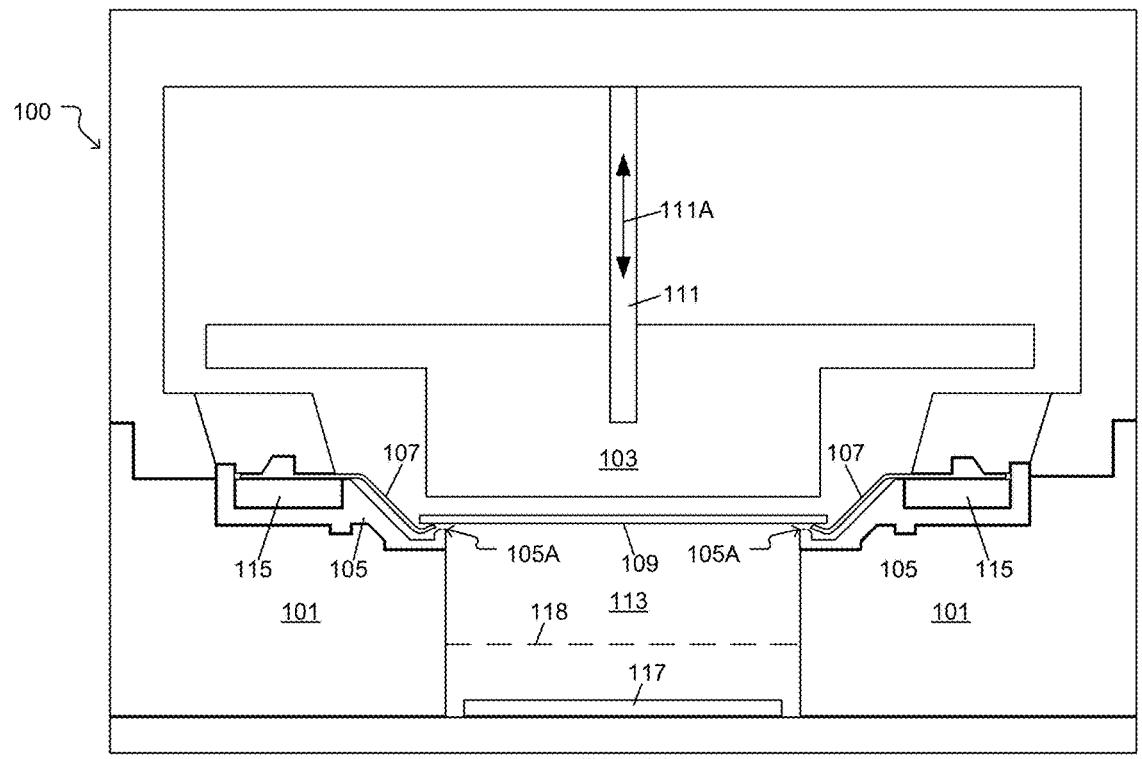
FIG. 1A shows a generalized diagram of a vertical cross-section of an electroplating apparatus for electroplating a wafer, in accordance with some embodiments of the present invention.

FIG. 1A shows a generalized diagram of a vertical cross-section of an electroplating apparatus 100 for electroplating a wafer 109, in accordance with some embodiments of the present invention. In an example embodiment, the term wafer as used herein refers to a semiconductor wafer. Also, in various embodiments, the wafer as referred to herein may vary in form, shape, and/or size. For example, in some embodiments, the wafer as referred to herein may correspond to a 200 mm (millimeters) semiconductor wafer, a 300 mm semiconductor wafer, or a 450 mm semiconductor wafer.

The electroplating apparatus 100 includes a cup member 101 and a cone member 103. The electroplating apparatus 100 also includes a lip seal component 105 configured to engage with a top of the cup member 101. A number of finger contacts 107 are disposed on top of the lip seal component 105. The finger contacts 107 are arranged in a circular configuration to provide substantially uniform support to a peripheral edge region of the wafer 109 to be processed.

Figure 2A:
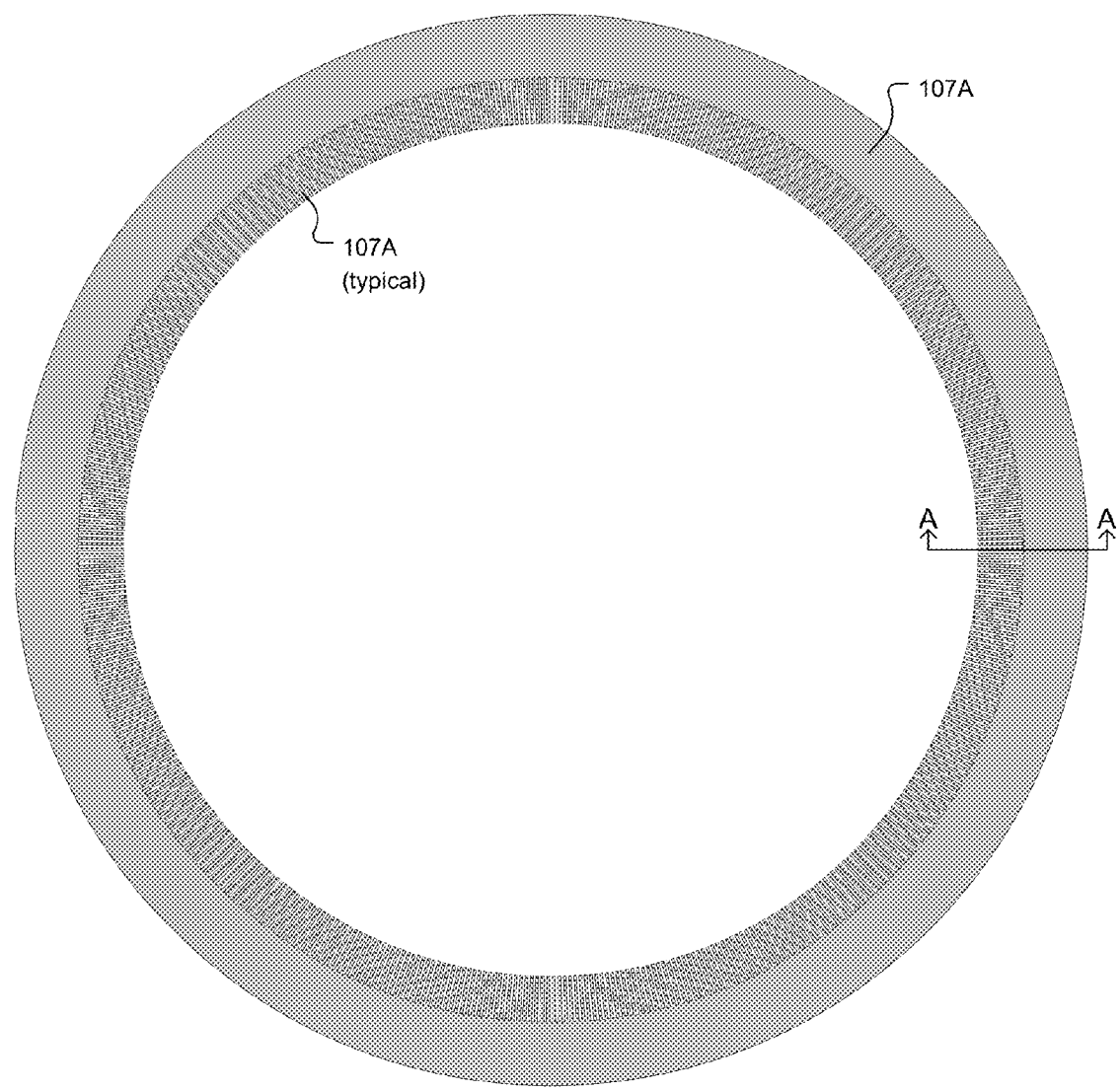
FIG. 2A shows a top view of the finger contacts, in accordance with some embodiments of the present invention.
Figure 2B:
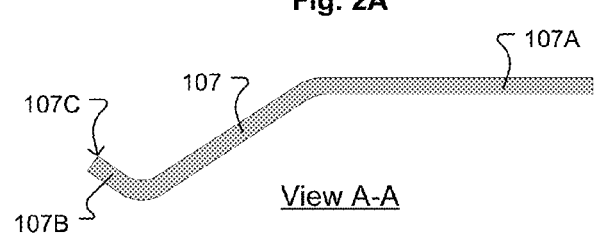
FIG. 2B shows a vertical cross-section view, "View A-A" as referenced in FIG. 2A, through one of the finger contacts, in accordance with some embodiments of the present invention.

FIG. 2A shows a top view of the finger contacts 107, in accordance with some embodiments of the present invention. FIG. 2B shows a vertical cross-section view, "View A-A" as referenced in FIG. 2A, through one of the finger contacts 107, in accordance with some embodiments of the present invention. As shown in FIG. 2A the number of finger contacts 107 are integrally formed in connection with a ring-shaped conductive strip 107A, e.g., metallic strip. Both the finger contacts 107 and the conductive strip 107A are electrically conductive. It should be understood that in various embodiments, the finger contacts 107 and the conductive strip 107A can be formed from any electrically conductive material that provides sufficient electrical conduction for performance of the electroplating process and that has sufficient mechanical properties for supporting the wafer 109 during the electroplating process and that is chemically compatible with the environment and materials to which it is exposed during the electroplating process.

As shown in FIGS. 2B and 1A, the finger contact 107 is shaped so as to bend down following an upper contour of the top of the lip seal member 105. And, an interior end section 107B of the finger contact 107, relative to the circumferential configuration of the conductive strip 107A, is turned upward to provide a support surface 107C for the wafer 109. More specifically, during the electroplating process, the wafer 109 is positioned on the support surfaces 107C of the finger contacts 107, with the surface of the wafer 109 that is to be electroplated facing downward so as to physically contact the support surfaces 107C of the finger contacts 107.

Figure 1B:
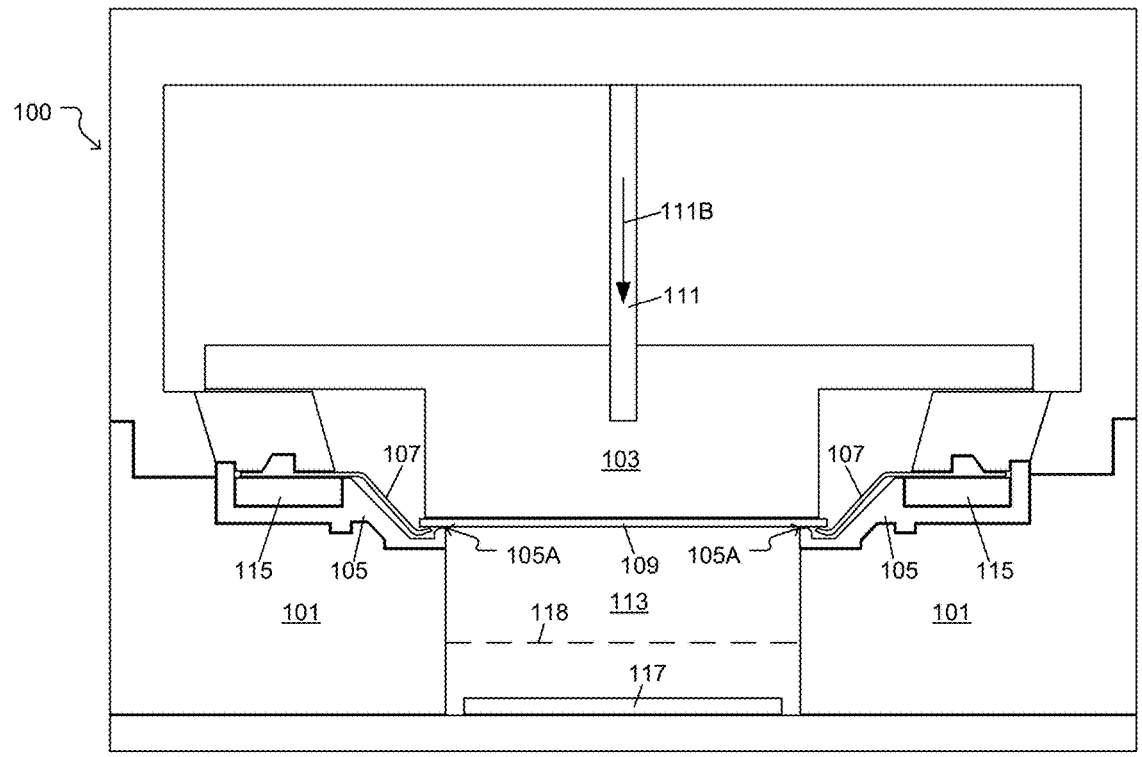
FIG. 1B shows the diagram of FIG. 1A with the cone member moved downward to interface with the wafer, so as press the peripheral downward facing region of the wafer against a sealing surface of the lip seal member, in accordance with some embodiments of the present invention.

The cone member 103 is attached to a shaft 111 that is configured to move up and down relative to the cup member 101, as indicated by arrow 111A. During the electroplating process, the cone member 103 is moved downward to interface with the wafer 109 and press the wafer 109 onto the support surfaces 107C of the finger contacts 107, so as to flex the interior end sections 107B of the finger contacts 107 downward toward the lip seal member 105, and so as to press the peripheral downward facing region of the wafer 109 against a sealing surface 105A of the lip seal member 105. FIG. 1B shows the diagram of FIG. 1A with the cone member 103 moved downward to interface with the wafer 109, as indicated by arrow 111B, so as press the peripheral downward facing region of the wafer 109 against a sealing surface 105A of the lip seal member 105, in accordance with some embodiments of the present invention.

An interior region of the cup 101 forms a bath volume 113 for containing an electroplating solution. When the wafer 109 is pressed against the sealing surface 105A of the lip seal member 105 by the downward force exerted by the cone 103, a seal is formed between the wafer 109 and the sealing surface 105A so that electroplating solution will not get past the contact location between the wafer 109 and the sealing surface 105A of the lip seal member 105, thereby keeping electroplating solution away from the finger contacts 107.

The electroplating apparatus 100 also includes a bus bar 115 disposed to physically contact the conductive strip 107A, thereby establishing an electrical connection between the bus bar 115 and the finger contacts 107. The bus bar is formed of a solid piece of metal for improvement in azimuthal electroplating uniformity about a periphery of the wafer 109.

The bath volume 113 includes an anode member 117. In some embodiments, the anode member 117 is formed of copper. However, in other embodiments, the anode member 117 can be formed of other electrically conductive materials suitable for the particular electroplating process that is being performed. In some embodiments, a membrane 118 is disposed within the bath volume 113 to physically separate an anodic region below the membrane 118 from a cathodic region above the membrane 118. The membrane 118 is configured to prevent bulk communication of electrolyte (electroplating solution) between the anodic region and the cathodic region, while allowing for ionic communication between the anodic region and the cathodic region. In some embodiments, the membrane 118 is an ion selective membrane.

During the electroplating process, a positive terminal of a direct current power supply is electrically connected to the anode member 117, and a negative terminal of the direct current power supply is electrically connected to the bus bar 115. In this manner an electrical current flow path is established from the anode member 117 through the electroplating solution to the surface of the wafer 109 exposed to the electroplating solution, and from the surface of the wafer 109 to the finger contacts 107, and from the finger contacts 107 to the bus bar 115. Typically, prior to the electroplating process, a conductive seed layer is formed on the surface of the wafer 109 to be plated, thereby providing initial electrical conductivity across the wafer 109. Then, as material deposits/grows on the wafer 109 during the electroplating process, the deposited material contributes to the electrical conductivity across the wafer 109.

Over the course of numerous electroplating process cycles, some electroplating solution may intrude past the contact location between the wafer 109 and the sealing surface 105A of the lip seal member 105 and reach the finger contacts 107. When this occurs, some material may be plated onto the finger contacts 107 and/or onto the lip seal member 105. When material is plated onto the finger contacts 107 and/or onto the lip seal member 105, the electrical properties of those plated finger contacts 107 and/or plated portion(s) of the lip seal member 105 will change so as to cause adverse plating results on the wafer 109 at locations which are electrically influenced by the changed electrical properties of the plated finger contacts 107 and/or plated portion(s) of the lip seal member 105. For example, the adverse plating results on the wafer 109 may manifest as regions of thinner plated material thickness, which in turn introduces plating non-uniformity across the wafer 109, which in turn can lead to semiconductor device fabrication difficulty and/or defects.

Figure 3A:
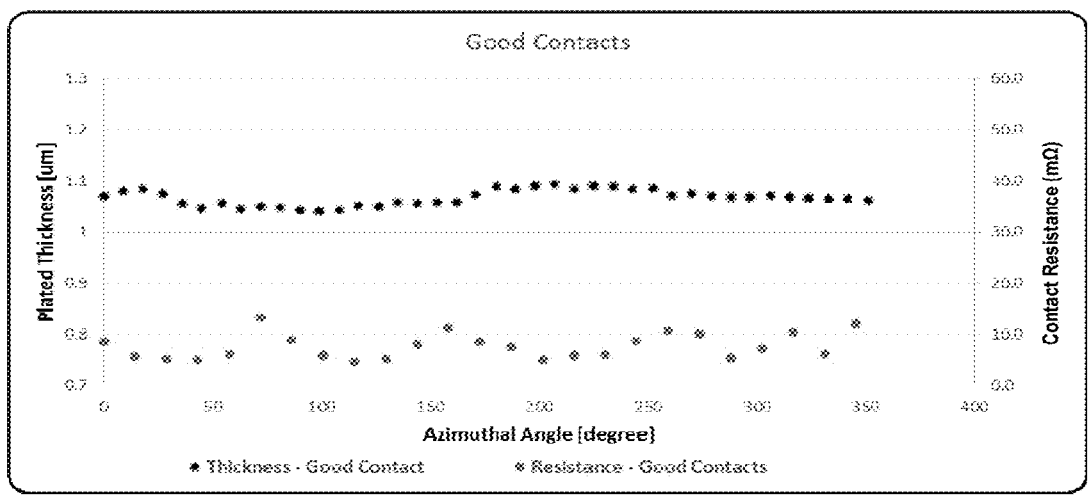
FIG. 3A shows example plots of plated thickness and finger contact electrical resistance as a function of azimuthal angle along a given radius of the wafer, where all the finger contacts have acceptable electrical resistance, in accordance with an example embodiment of the present invention.

FIG. 3A shows example plots of plated thickness and finger contact 107 electrical resistance as a function of azimuthal angle along a given radius of the wafer 109, where all the finger contacts 107 have acceptable electrical resistance, in accordance with an example embodiment of the present invention. The plated thickness is presented in units of micrometers. The finger contact 107 electrical resistance is presented in units of milliohms. The azimuthal angle is measured about a central axis of the wafer 109 extending perpendicular to the top and bottom surfaces of the wafer 109 and through the centerpoint of the wafer 109. As shown in FIG. 3A, with finger contacts 107 of good condition, the plated thickness of material is substantially uniform along the given radius of the wafer 109, which is the desired plating result.

Figure 3B:
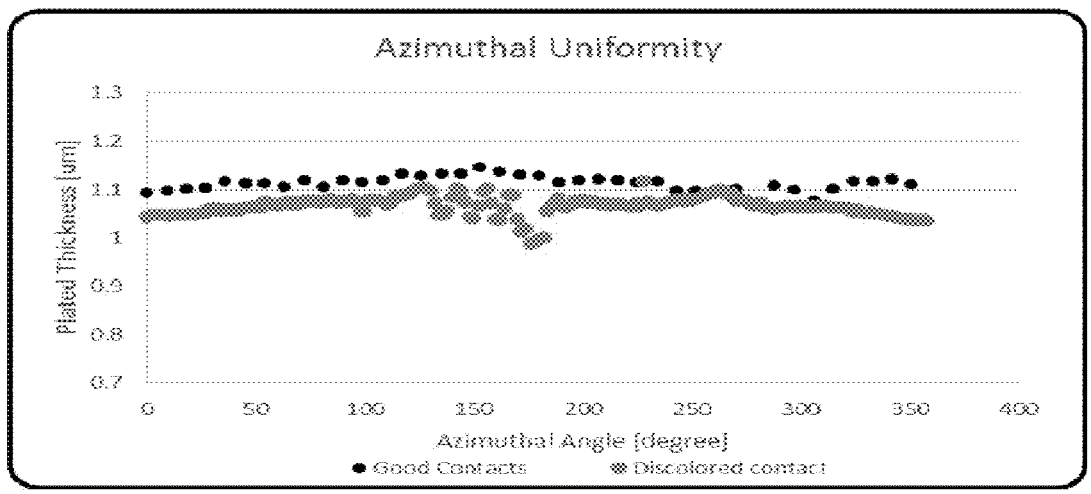
FIG. 3B shows plots of plated thickness obtained for two wafers using finger contacts of all good condition for one wafer and using some finger contacts of poor condition for the other wafer, in accordance with an example embodiment of the present invention.

FIG. 3B shows plots of plated thickness obtained for two wafers 109 using finger contacts 107 of all good condition for one wafer 109 and using some finger contacts 107 of poor condition for the other wafer 109, in accordance with an example embodiment of the present invention. The plated thickness plots of FIG. 3B are shown as a function of azimuthal angle along a given radius of the two wafers 109. The finger contacts 107 of poor condition have been subjected to undesirable electroplating due to electroplating solution leakage past the contact location between the wafer 109 and the sealing surface 105A of the lip seal member 105. Because the electroplating on the finger contacts 107 of poor condition causes some discoloration, these finger contacts 107 of poor condition are referred to as discolored contacts and have electrical properties, e.g., electrical resistance, outside of acceptable specifications. As shown in FIG. 3B, based on the aberration in plating thickness, the discolored finger contacts 107 appear to be located between azimuthal angles of about 130 degrees and about 188 degrees.

Figure 3C:
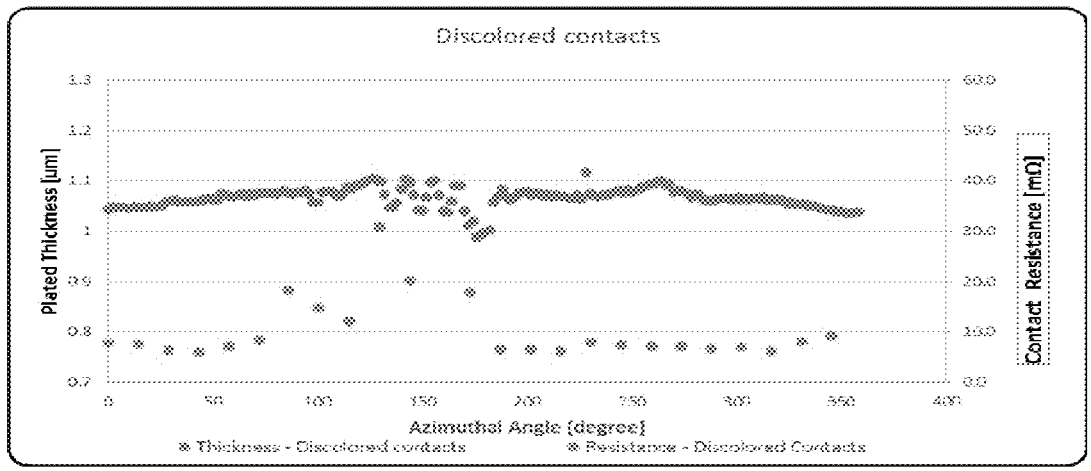
FIG. 3C shows the plot of plating thickness for the wafer plated using some discolored finger contacts as a function of azimuthal angle at a given radius as shown in FIG. 3B, in conjunction with a plot of electrical resistance of the finger contacts used for the plating as a function of azimuthal angle at the given radius, in accordance with an example embodiment of the present invention.

FIG. 3C shows the plot of plating thickness for the wafer 109 plated using some discolored finger contacts 107 as a function of azimuthal angle at a given radius as shown in FIG. 3B, in conjunction with a plot of electrical resistance of the finger contacts 107 used for the plating as a function of azimuthal angle, in accordance with an example embodiment of the present invention. FIG. 3C shows that at the azimuthal angle locations where the plating thickness was non-uniform, the corresponding discolored finger contacts 107 have high electrical resistance relative to the other finger contacts 107, which indicates undesirable plating of material on the discolored finger contacts 107.

In view of the foregoing, it should be understood that maintaining acceptable electroplating results in terms of plating thickness and uniformity is dependent upon maintaining good condition of the finger contacts 107 and lip seal member 105. And, in order to maintain good condition of the finger contacts 107 and lip seal member 105 it is necessary to monitor whether or not electroplating has occurred on the finger contacts 107 and/or lip seal member 105 and to what extent. Also, this monitoring should be done in a manner that does not significantly affect the availability of the electroplating apparatus 100.

Figure 4A:
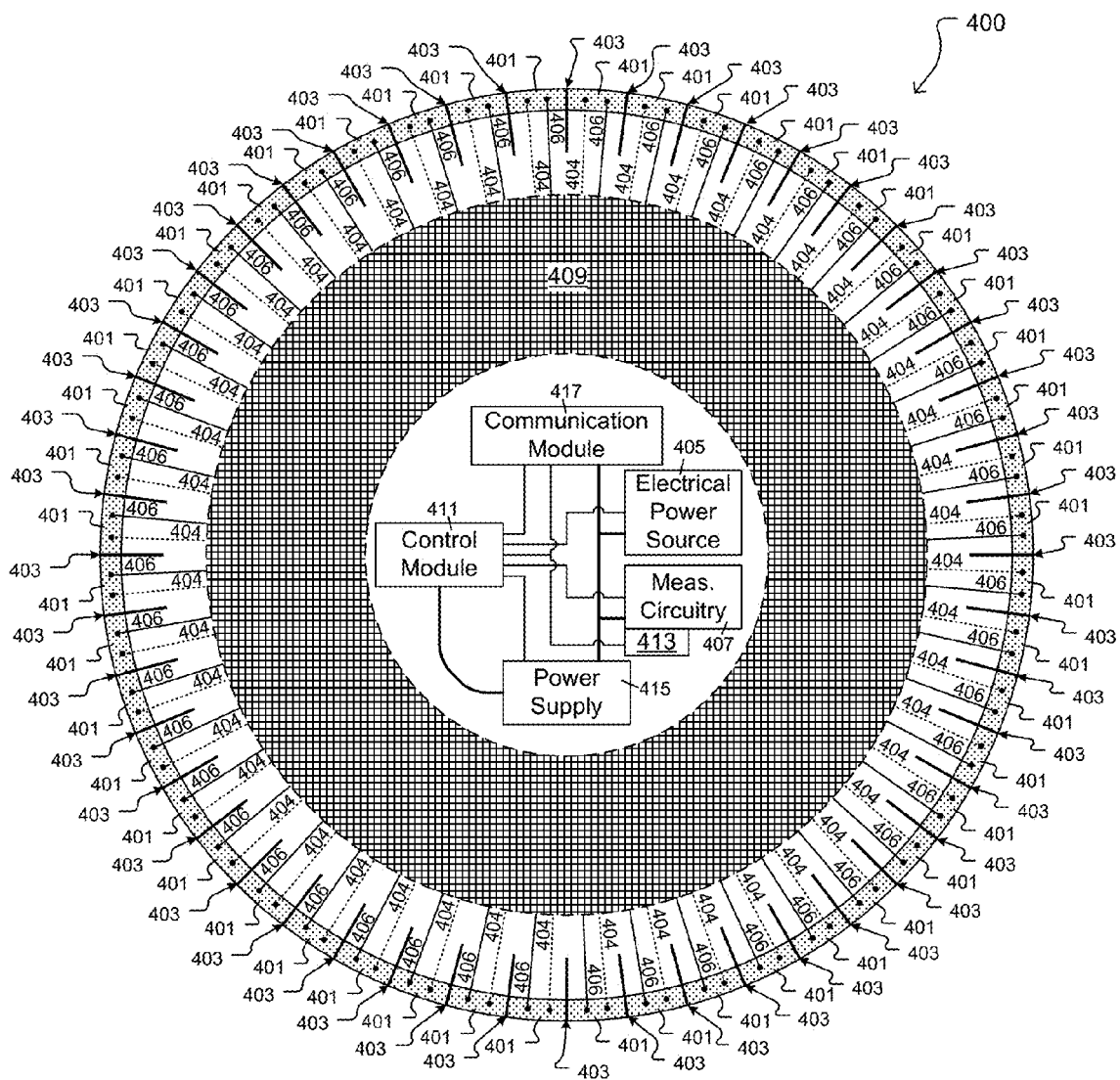
FIG. 4A shows a top view of a device for measuring electrical conditions of the finger contacts and the lip seal member in the electroplating apparatus, in accordance with some embodiments of the present invention.

FIG. 4A shows a top view of a device 400 (measurement device 400) for measuring electrical conditions of the finger contacts 107 and the lip seal member 105 in the electroplating apparatus 100, in accordance with some embodiments of the present invention. The device 400 includes a printed circuit board having a form factor similar to that of the wafer 109. Therefore, the device 400 can be handled in the same manner as the wafer 109 and can be positioned within the electroplating apparatus 100 in the same manner as the wafer 109. Also, the device 400 can be moved around like any wafer using any wafer handling equipment in the fabrication facility. Additionally, the device 400 can be stored like any wafer. In some embodiments, the device 400 is stored in a companion wafer slot of the electroplating tool and is placed in the electroplating apparatus 100 by the wafer handling robot to provide for measurement by the device 400 of the electrical properties of the finger contacts 017 and/or lip seal member 105. However, it should be understood that in some embodiments the device 400 can be positioned in the electroplating apparatus 100 by hand to provide for measurement by the device 400 of the electrical properties of the finger contacts 017 and/or lip seal member 105.

The device 400 includes multiple exposed electrically conductive pads 401 positioned along an outer radial region of the device 400. Each neighboring pair of conductive pads 401 are electrically separated from each other by an isolating member 403, e.g., electrical insulator material. Each conductive pad 401 includes an electrical connection 404 to an electrical power source 405 and an electrical connection 406 to measurement circuitry 407. In some embodiments, the electrical power source 405 can be configured to supply a controlled amount of electric current through an electrically conductive path extending between a first terminal 405A of the electrical power source 405 and a second terminal 405B of the electrical power source 405. In some embodiments, the electrical power source 405 is configured to supply a controlled amount of electric voltage between the first terminal 405A of the electrical power source 405 and the second terminal 405B of the electrical power source 405. The electrical connections 404 of all the conductive pads 401 are made through switching circuitry 409 to the electrical power source 405, such that electrical current and/or voltage can be supplied to any one or more of the conductive pads 401 at a give time. And, the electrical connections 406 of all the conductive pads 401 are made through the switching circuitry 409 to the measurement circuitry 407, such that an electrical parameter present on any one or more of the conductive pads 401 can be measured at a given time. In some embodiments, the measurement circuitry 407 includes analog-to-digital conversion circuitry for converting measured analog electrical parameters into a digital format. The measurement circuitry 407 also includes a memory module 413 for storing the measured electrical parameters in the digital format.

Each of the electrical power source 405, the measurement circuitry 407, and the switching circuitry 409 is configured to operate under the direction of a control module 411. In this manner, at a given time, the control module 411 operates to direct the switching circuitry 409 to connect a particular one (or more) of the conductive pads 401 to the electrical power source 405 and to connect a particular one (or more) of the conductive pads 401 to the measurement circuitry 407. Also, each of the electrical power source 405, the measurement circuitry 407, and the switching circuitry 409 is connected to receive electrical power from a power supply 415. In some embodiments, the power supply 415 is a battery. In some embodiments, the power supply 415 is a rechargeable battery.

Also, the device 400 includes a communication module 417 configured to communicate digital data corresponding to electrical parameters measured by the measurement circuitry 407 and/or digital data corresponding to a condition of the device 400. In some embodiments, the communication module 417 is configured to wirelessly transmit digital data to a wireless receiver in range of the device 400. And, in some embodiments, the communication module 417 is configured to support a wired connection to the device 400 through which the digital data can be transmitted. And, in some embodiments, the communication module 417 is configured to support both a wireless communication mode and a wired communication mode. The communication module 417 is connected to receive power from the power supply 415. Therefore, in the case where the communication module 417 is configured to support the wireless communication mode, the device 400 is able to operate in a completely autonomous and independent manner such that the device 400 can be moved through the fabrication facility and through the electroplating tool in the same manner as the wafer 109.

Additionally, the control module 411 can be programmed through the communication module 417 to direct performance of any prescribed form of measurement using the electrical power source 405 and the measurement circuitry 407. Therefore, it should be appreciated that the control module 411 is connected to communicate control signals to and receive data signals from each of the communication module 417, the electrical power source 405, the measurement circuitry 407, the memory module 413, the power supply 415, and the switching circuitry 409.

Figure 4B:
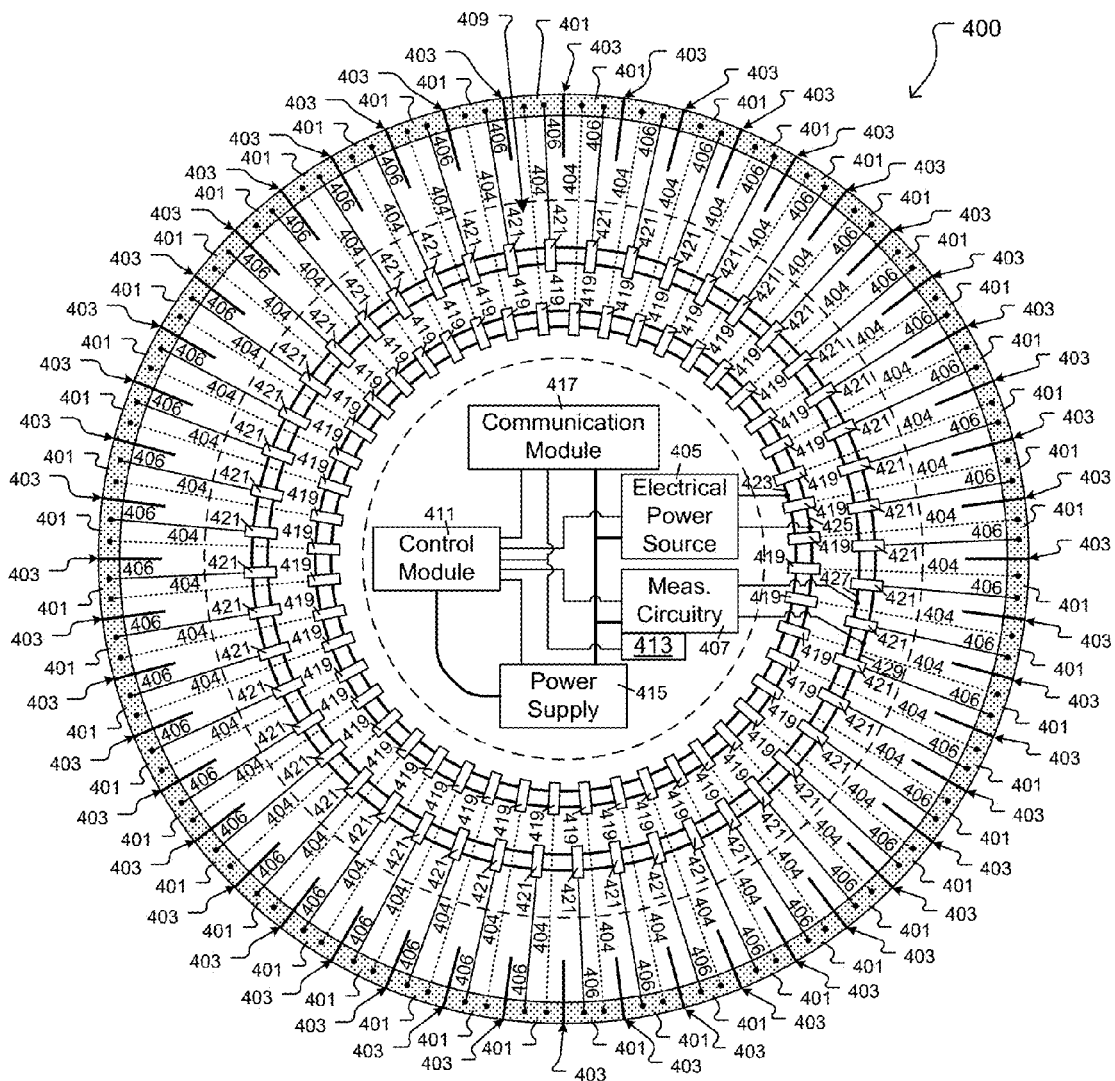
FIG. 4B shows the device from FIG. 4A with the switching circuitry shown in more detail, in accordance with some embodiments of the present invention.

FIG. 4B shows the device 400 from FIG. 4A with the switching circuitry 409 shown in more detail, in accordance with some embodiments of the present invention. It should be understood that the particular switching circuitry 409 configuration of FIG. 4B is provided by way of example. In other embodiments, the switching circuitry 409 can be configured differently from what is shown in the example of FIG. 4B. More specifically, in other embodiments, the switching circuitry 409 can be configured in essentially any manner so long as the functionality is present to electrically connect a selected one or more of the conductive pads 401 to the electrical power source 405 at a given time and to electrically connect a selected one or more of the conductive pads 401 to the measurement circuitry 407 at the given time. Also, it should be understood that any of the electrical connectivity shown or described herein with regard to the device 400 can be implemented in/on the printed circuit board of the device 400 using essentially any appropriate configuration of electrical traces. And, in some embodiments, the printed circuit board 400 of the device can include multiple layers of electrical traces, with neighboring layers of electrical traces separated from each other by a dielectric material, and with via conductors used to connect electrical traces in different layers as needed.

In the switching circuitry 409 configuration of FIG. 4B, each electrical connection 404 extends from a corresponding conductive pad 401 to a corresponding current switch module 419. And, each electrical connection 406 extends from a corresponding conductive pad 401 to a corresponding measurement switch module 421. Therefore, each of the conductive pads 401 has a corresponding current switch module 419 and a corresponding measurement switch module 421.

A power bus 423 is provided for connection with each of the current switch modules 419. And, a reference ground bus 425 is provided for connection with each of the current switch modules 419. Both the power bus 423 and the reference ground bus 425 are electrically connected to the electrical power source 405, such that the current source 425 can be operated to supply electric current to the power bus 423 and sink electric current from the reference ground bus 425, under the control of the control module 411.

A first measurement bus 427 is provided for connection with each of the measurement switch modules 421. And, a second measurement bus 429 is provided for connection with each of the measurement switch modules 421. Both the first measurement bus 427 and the second measurement bus 429 are electrically connected to the measurement circuitry 407. Under the control of the control module 411, the measurement circuitry 407 can be operated to sense at a given time an electrical signal on the first measurement bus 427 and/or an electrical signal on the second measurement bus 429.

Figure 5:
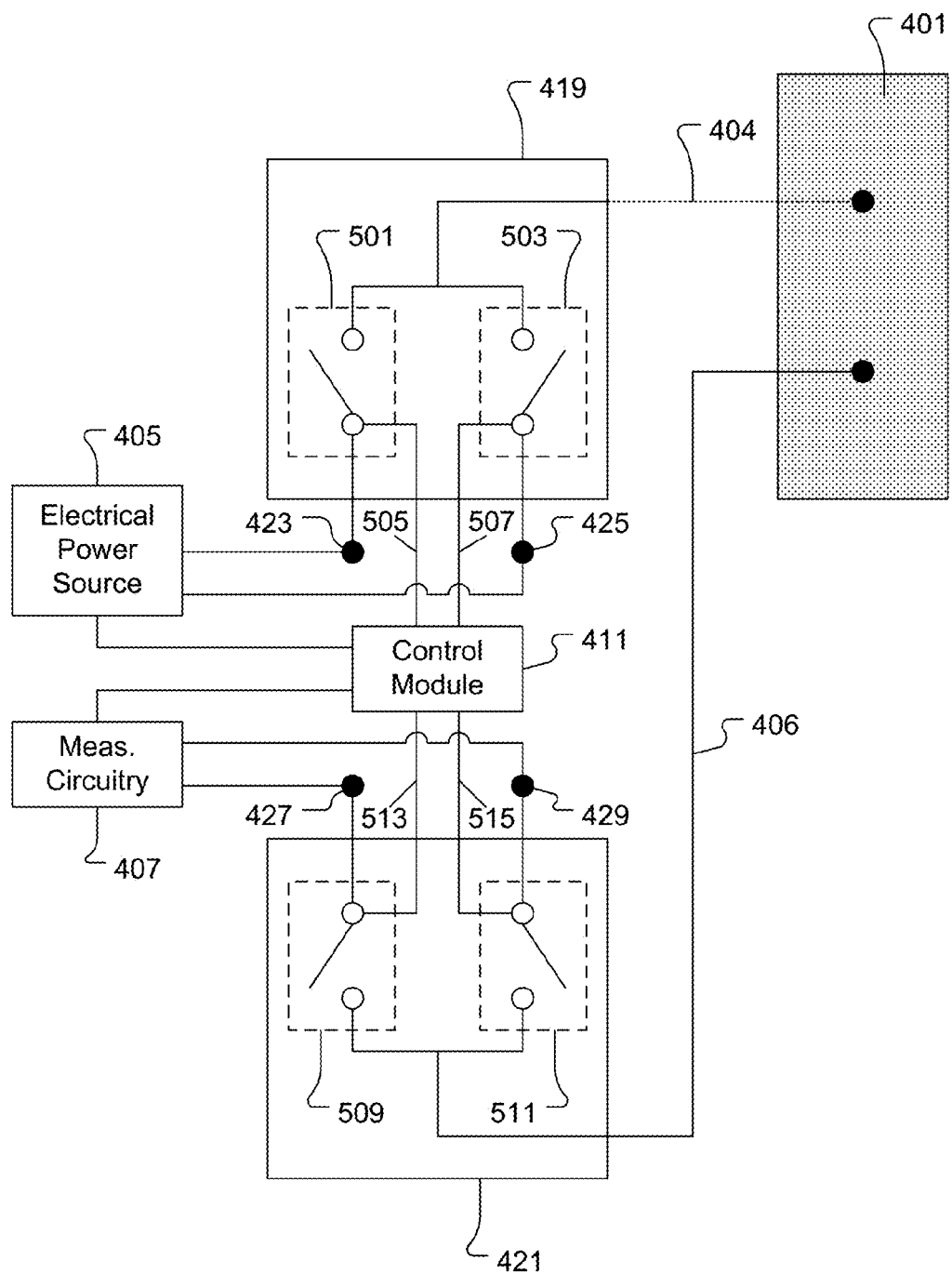
FIG. 5 shows an electrical diagram of a given conductive pad with its electrical connection to its current switch module and with its electrical connection to its measurement switch module, in accordance with some embodiments of the present invention.

FIG. 5 shows an electrical diagram of a given conductive pad 401 with its electrical connection 404 to its current switch module 419 and with its electrical connection 406 to its measurement switch module 421, in accordance with some embodiments of the present invention. Within the current switch module 419, the electrical connection 404 is connected to a pair of switch devices 501 and 503. In some embodiments, each switch device 501 and 503 is implemented as an integrated circuit switching device. However, in some embodiments, the switch devices 501 and 503 can be implemented as analog switching devices. Each switch device 501 and 503 is under the control of the control module 411 as indicated by connections 505 and 507, respectively. The switch device 501 has a terminal connected to the power bus 423, which is in turn connected to the electrical power source 405 as previously discussed. And, the switch device 503 has a terminal connected to the reference ground bus 425, which is in turn connected to the electrical power source 405 as previously discussed. With this configuration, the control module 411 can operate the switch devices 501 and 503 to electrically connect the conductive pad 401 to either the power bus 423 or to the reference ground bus 425. In this manner, depending on the settings of the switch devices 501 and 503 within the current switch module 419, electric current and/or voltage can be applied from the electrical power source 405 to the particular conductive pad 401 at a given time, or the particular conductive pad 401 can be electrically connected to a reference ground potential at the given time.

Within the measurement switch module 421, the electrical connection 406 is connected to a pair of switch devices 509 and 511. In some embodiments, each switch device 509 and 511 is implemented as an integrated circuit switching device. However, in some embodiments, the switch devices 509 and 511 can be implemented as analog switching devices. Each switch device 509 and 511 is under the control of the control module 411 as indicated by connections 513 and 515, respectively. The switch device 509 has a terminal connected to the first measurement bus 427, which is in turn connected to the measurement circuitry 407 as previously discussed. And, the switch device 511 has a terminal connected to the second measurement bus 429, which is in turn connected to the measurement circuitry 421 as previously discussed. With this configuration, the control module 411 can operate the switch devices 509 and 511 to electrically connect the conductive pad 401 to either the first measurement bus 427 or to the second measurement bus 429. In this manner, depending on the settings of the switch devices 509 and 511 within the current switch module 421, measurement circuitry 407 can be connected to sense a high current and/or voltage at the particular conductive pad 401 at a given time, or sense a low current and/or voltage at the particular conductive pad 401 at the given time.

Figure 6A:
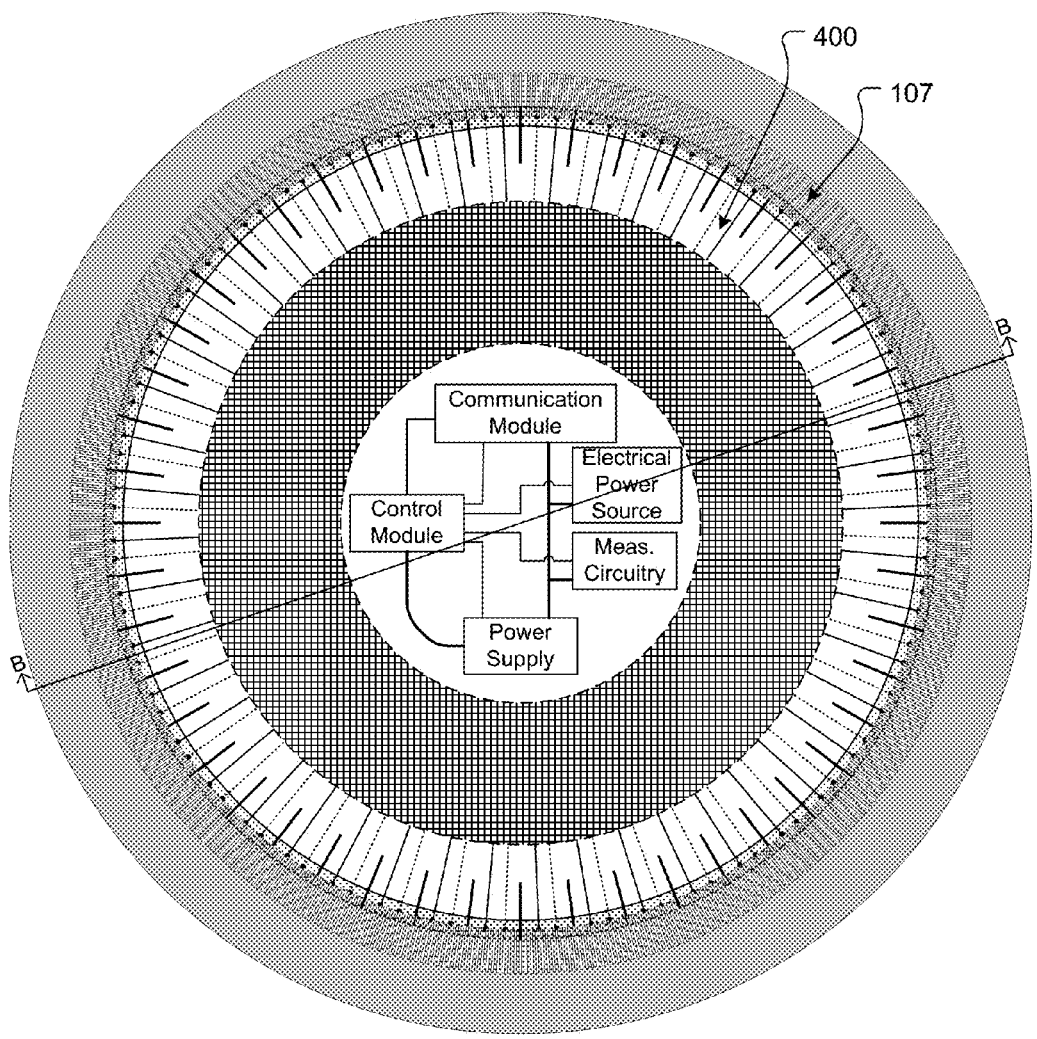
FIG. 6A shows a diagram of the device positioned to rest on the support surfaces 107C of the finger contacts, in accordance with some embodiments of the present invention.

FIG. 6A shows a diagram of the device 400 positioned to rest on the support surfaces 107C of the finger contacts 107, in accordance with some embodiments of the present invention. The view depicted in FIG. 6A is from a perspective inside the bath volume 113 looking upward toward the cone member 103. As shown in FIG. 6A, the conductive pads 401 make contact with the support surfaces 107C of the finger contacts 107, so as to establish an electrical conduction path between each conductive pad 401 and a corresponding subset of the finger contacts 107 that are in physical contact with the conductive pad 401. In this manner, each of the conductive pads 401 is electrically connected with a different subset of the finger contacts 107.

Figure 6B:
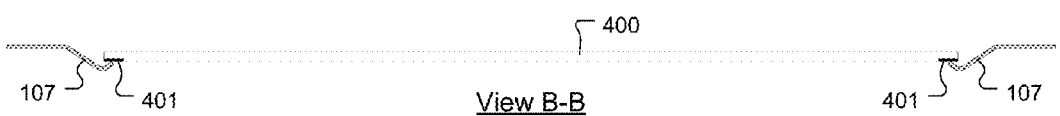
FIG. 6B shows a vertical cross-section view, "View B-B" as referenced in FIG. 6A, through the device and finger contacts, in accordance with some embodiments of the present invention.

FIG. 6B shows a vertical cross-section view, "View B-B" as referenced in FIG. 6A, through the device 400 and finger contacts 107, in accordance with some embodiments of the present invention. As shown in FIG. 6A, the device 400 is positioned such that the conductive pads 401 rest upon the support surfaces 107C of the finger contacts 107. Just as with the wafer 109 undergoing electroplating processing, the device 400 can be contacted by the cone member 103 to press the conductive pads 401 onto the support surfaces 107C of the finger contacts 107 with a precisely controlled amount of downward force. Also, it should be understood that the rotational position of the device 400 can be indexed to the electroplating apparatus 100 so as to know which subset of the finger contacts 107 is in physical contact with a particular one of the conductive pads 401. Because the device 400 has a form factor similar to that of the wafer 109, the device 400 can be rotationally indexed to the electroplating apparatus 100 using a standard wafer aligner device available at a fabrication station to which the electroplating apparatus 100 is connected.

With an appropriate setting of the switching circuitry 409, electric current and/or voltage can be directed from the electrical power source 405 through a given conductive pad 401 to a specific subset of finger contacts 107 in physical connection with the given conductive pad. And, with an appropriate setting of the switching circuitry 409, a specific subset of finger contacts 107 in physical connection with a given conductive pad 401 can be electrically connected to a reference ground potential. In this manner, through operation of the control module 411 and switching circuitry 409, a precisely controlled electric current can be directed to flow into a first conductive pad 401 at a first azimuthal location about the periphery of the device 400, and through a first specific subset of finger contacts 107 in physical contact with the first conductive pad 401, and from the first specific subset of finger contacts 107 through the conductive strip 107A (and possibly through other electrically conductive components in contact with the conductive strip 107A such as the bus bar 115) to a second specific subset of finger contacts 107 at a second azimuthal location about the periphery of the device 400, and from the second specific subset of finger contacts 107 to a second conductive pad 401 at the second azimuthal location about the periphery of the device 400, and from the second conductive pad 401 to the reference ground potential. And, similarly, through operation of the control module 411 and switching circuitry 409, a precisely controlled electric voltage can be applied between the first conductive pad 401 at the first azimuthal location about the periphery of the device 400 and the second conductive pad 401 at the second azimuthal location about the periphery of the device 400.

The control module 411 can be programmed to direct operation of the switching circuitry 409 to select any of the conductive pads 401 for the first azimuthal location and any of the conductive pads 401 for the second azimuthal location. In some embodiments, the second azimuthal location corresponds to a conductive pad 401 that is positioned next to the first conductive pad 401, where the first conductive pad 401 corresponds to the first azimuthal location. In some embodiments, multiple conductive pads 401 are selected to provide multiple second azimuthal locations. For example, in some embodiments, multiple second azimuthal locations correspond to two conductive pads 401 respectively positioned on each side of the first conductive pad 401. In this particular example, the electric current will flow into the first conductive pad 401 can back through both of the two conductive pads 401 neighboring the first conductive pad 401.

In conjunction with operating the device 400 to direct the flow of precisely controlled electric current into the first subset of the finger contacts 107 at the first azimuthal location and back out of the second subset of the finger contacts 107 at the second azimuthal location, the control module 411 can be programmed to direct the switching circuitry 409 to connect the measurement circuitry 407 to one or both of the first conductive pad 401 at the first azimuthal location and the second conductive pad 401 at the second azimuthal location, thereby providing for measurement of electrical voltage and/or current at one or both of the first conductive pad 401 at the first azimuthal location and the second conductive pad 401 at the second azimuthal location.

The electrical resistance of the conductive paths, e.g., traces, within the device 400 are carefully measured upon manufacture of the device 400. Therefore, when the precisely controlled electrical current is flowed into the first subset of the finger contacts 107 and back out of the second subset of finger contacts 107, the electrical resistance along the electrical conduction path between the first subset of the finger contacts 107 and the second subset of the finger contacts 107 can be measured and compared to an allowable range of electrical resistance to determine if adverse electrical plating has occurred along the electrical conduction path between the first subset of the finger contacts 107 and the second subset of the finger contacts 107. In this manner, the device 400 can be operated to measure the electrical resistance between different subsets of finger contacts 107 about an entire periphery of the device 400 so as to fully characterize the electrical resistance of the entirety of finger contacts 107 and identify whether or not adverse electroplating has occurred on specific ones of the finger contacts 107.

Figure 7:
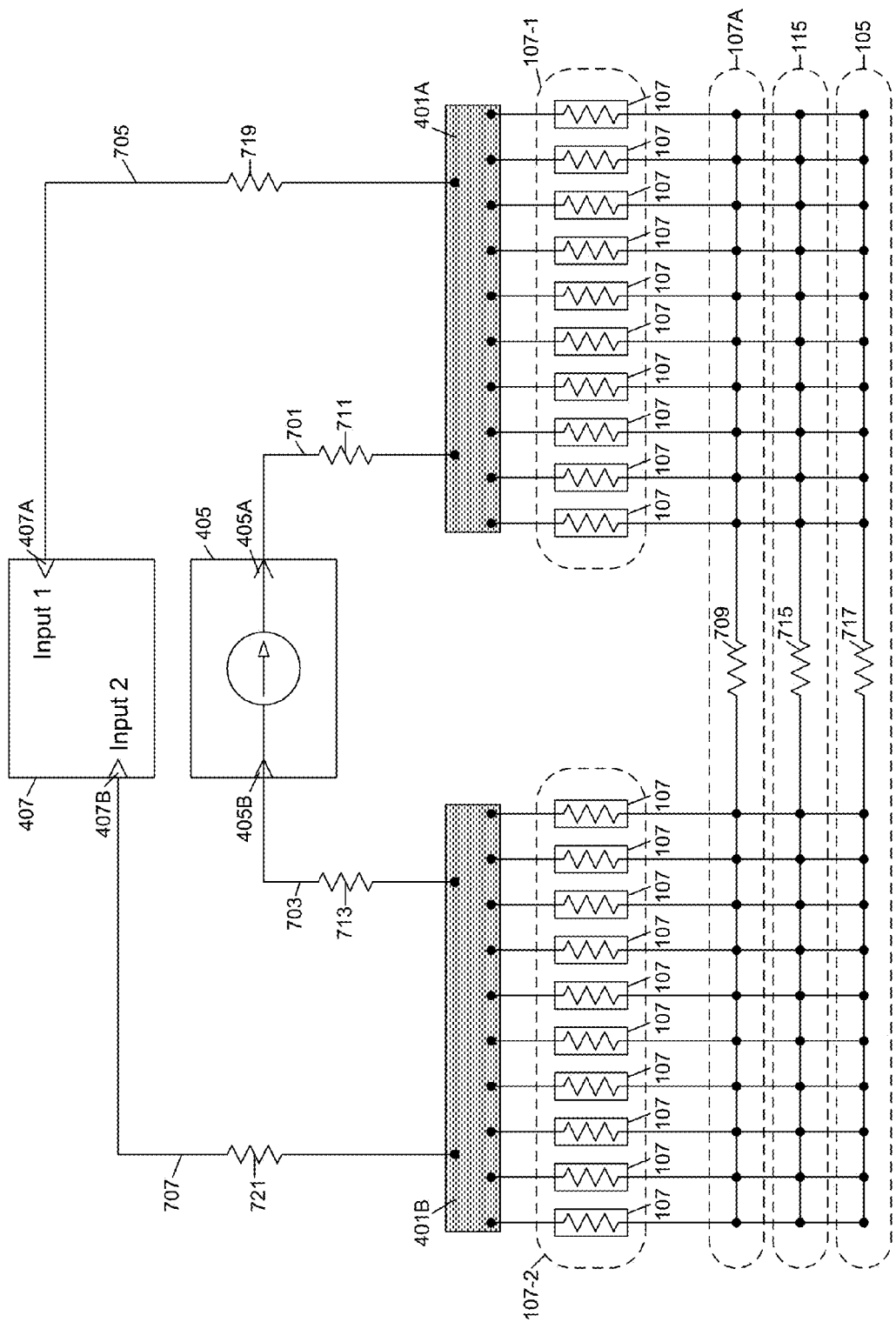
FIG. 7 shows an electrical circuit diagram representing connection of the current source to supply electric current to a first conductive pad and connection of a second conductive pad to sink electric current back to the current source, in accordance with some embodiments of the present invention.

FIG. 7 shows an electrical circuit diagram representing connection of the electrical power source 405 to supply electric current to a first conductive pad 401A and connection of a second conductive pad 401B to sink electric current back to the electrical power source 405, in accordance with some embodiments of the present invention. The electrical power source 405 is configured to supply electric current at a first terminal 405A and sink electric current at a second terminal 405B. The electrical power source 405 is connected to supply electric current to the first conductive pad 401A through an electrical connection 701. As previously discussed with regard to FIG. 5, the electrical connection 701 is routed through the switching circuitry 409 to the first conductive pad 401A. An electrical resistance 711 along the electrical connection 701 is measured and known. The electrical power source 405 is connected to sink electric current from the second conductive pad 401B through an electrical connection 703. As previously discussed with regard to FIG. 5, the electrical connection 703 is routed through the switching circuitry 409 to the second conductive pad 401B. An electrical resistance 713 along the electrical connection 703 is measured and known.

FIG. 7 also shows a first subset 107-1 of finger contacts 107 in electrical connection with the first conductive pad 401A, and a second subset 107-2 of finger contacts 107 in electrical connection with the second conductive pad 401B. Each finger contact 107 in the first subset 107-1 of finger contacts 107 is electrically connected to each finger contact 107 in the second subset 107-2 of finger contacts 107 through the conductive strip 107A. An electrical resistance 709 along the portion of the conductive strip 107A between the first subset 107-1 of finger contacts 107 and the second subset 107-2 of finger contacts 107 is measured and known. Also, the conductive strip 107A is in electrical connection with the bus bar 115. An electrical resistance 715 along the portion of the bus bar 115 between the first subset 107-1 of finger contacts 107 and the second subset 107-2 of finger contacts 107 is measured and known. Also, the conductive strip 107A is in electrical connection with the lip seal member 105. An electrical resistance 717 along the portion of the lip seal member 105 between the first subset 107-1 of finger contacts 107 and the second subset 107-2 of finger contacts 107 is unknown due to the possibility of having plated material on the lip seal member 105.

The measurement circuitry 407 is connected to measure an electrical property, e.g., current and/or voltage, present on the first conductive pad 401A through an electrical connection 705 routed to a first input 407A of the measurement circuitry 407.

As previously discussed with regard to FIG. 5, the electrical connection 705 is routed through the switching circuitry 409 to the first conductive pad 401A. An electrical resistance 719 along the electrical connection 705 is measured and known. The measurement circuitry 407 is also connected to measure an electrical property, e.g., current and/or voltage, present on the second conductive pad 401B through an electrical connection 707 routed to a second input 407B of the measurement circuitry 407. As previously discussed with regard to FIG. 5, the electrical connection 707 is routed through the switching circuitry 409 to the second conductive pad 401B. An electrical resistance 721 along the electrical connection 707 is measured and known.

The various electrical resistances and other electrical properties between the electrical power source 405 and each of the first conductive pad 401A and the second conductive pad 401B are known. And, the various electrical resistances and other electrical properties between the measurement circuitry 407 and each of the first conductive pad 401A and the second conductive pad 401B are known. Also, the electrical resistance and other electrical properties along the conductive strip 107A between the first subset 107-1 of finger contacts 107 and the second subset 107-2 of finger contacts 107 are known. Also, the electrical resistance and other electrical properties along the bus bar 115 between the first subset 107-1 of finger contacts 107 and the second subset 107-2 of finger contacts 107 are known. Therefore, in the circuit of FIG. 7, an integrated electrical resistance through the various finger contacts 107 of the first subset 107-1 of finger contacts 107 and the second subset 107-2 of finger contacts 107, and through the portion of the lip seal member 105 extending between the first subset 107-1 of finger contacts 107 and the second subset 107-2 of finger contacts 107 are unknown due to the possibility of having plated material present on the finger contacts 107 and/or on the lip seal member 105.

By applying a precisely controlled electric current to the first conductive pad 401A and by sinking the applied electric current from the second conductive pad 401B, in conjunction with operating the measurement circuitry 407 to measure the electric voltage and/or current at each of the first conductive pad 401A and the second conductive pad 401B, the above-mentioned integrated electrical resistance can be measured and assessed to determined if adverse electroplating has occurred within the first subset 107-1 of finger contacts 107 and/or the second subset 107-2 of finger contacts 107 and/or through the portion of the lip seal member 105 extending between the first subset 107-1 of finger contacts 107 and the second subset 107-2 of finger contacts. In some embodiments, the measurement circuitry 407 includes a shunt resistor powered by the power supply 415 in combination with the electrical power source 405 to measure the electrical resistance through the finger contacts 107 and the lip seal member 105 along a selected azimuthal section of the electroplating apparatus 100. It should be understood that the device 400 provides for measurement of electrical resistance of finger contacts 107 and of the lip seal member 105 along any selected azimuthal section of the electroplating apparatus 100.

Through monitoring of the electrical properties of the finger contacts 107 and lip seal member 105, it is possible to raise an alarm for service of the electroplating apparatus 100 in the event that a condition of the finger contacts 107 and/or lip seal member 105 indicate a likelihood of producing an adverse electroplating result. Also, in some embodiments, additional sensors such as optical sensors can be implemented within the device 400 to provide for visual observation of groups of finger contacts 107 and of corresponding azimuthal sections of the lip seal member 105.

In some embodiments, the device 400 is stored in the companion wafer slot on the electroplating tool and is scheduled to be robotically moved to the electroplating apparatus 100 where measurements are made so that no user interaction is required. Once measurements are completed, the device 400 is returned to the companion wafer slot at which time the device 400 transfers the measurement data taken to the electroplating tool for logging and analysis. Also, trends in finger contact 107 electrical resistance and lip seal member 105 functionality can be logged as the components age.

In view of the foregoing, it should be understood that the device 400 disclosed herein provides for measuring electrical properties of electrical contacts within an electroplating apparatus, such as the electroplating apparatus 100, where the electroplating apparatus is configured to perform an electroplating process on the wafer 109. However, it should also be understood that in general the device 400 disclosed herein can be used for measuring electrical properties of electrical conduction paths within a semiconductor processing apparatus (which may or may not be an electroplating apparatus), where the semiconductor processing apparatus is configured to electrically connect the electrical conduction paths to a surface of the wafer 109 when performing a process on the wafer 109. The device 400 includes a disc-shaped structure having an outer diameter substantially equal to an outer diameter of the wafer 109. In some embodiments, the disc-shaped structure of the device 400 is a printed circuit board. The disc-shaped structure of the device 400 has an overall thickness substantially similar to an overall thickness of the wafer 109.

The device 400 includes multiple conductive pads 401 formed along an outer perimeter of a first side of the disc-shaped structure. Adjacently positioned ones of the multiple conductive pads 401 are electrically isolated from each other. In some embodiments, the disc-shaped structure of the device 400 is formed of an electrical insulating material, and adjacently positioned ones of the multiple conductive pads 401 are separated from each other by a portion of the disc-shaped structure, thereby providing electrical isolation between adjacently positioned ones of the multiple conductive pads 401. In some embodiments, electrical isolation structures, such as isolating members 403, are disposed on the disc-shaped structure to electrically isolate adjacently positioned ones of the multiple conductive pads 401 from each other. The multiple conductive pads 401 collectively circumscribe the outer perimeter of the first side of the disc-shaped structure. In some embodiments, each of the multiple conductive pads 401 has a substantially equal size as measured along the outer perimeter of the first side of the disc-shaped structure of the device 400.

The device 400 includes the electrical power source 405 having the first terminal 405A and the second terminal 405B. The electrical power source 405 is configured to supply electrical power through an electrically conductive path extending between the first terminal 405A and the second terminal 405B and through a portion of the semiconductor processing apparatus when the disc-shaped structure of the device 400 is positioned within the semiconductor processing apparatus. The first terminal 405A is electrically connected to a first set of at least one of the multiple conductive pads 401. The second terminal 405B is electrically connected to a second set of at least one of the multiple conductive pads 401. The second set of the multiple conductive pads 401 is exclusive of the first set of the multiple conductive pads 401. The first and second sets of the multiple conductive pads 401 form part of the electrically conductive path extending between the first terminal 405A and the second terminal 405B. In some embodiments, the electrical power source is configured to supply a controlled amount of electric current through the electrically conductive path extending between the first terminal 405A and the second terminal 405B. In some embodiments, the electrical power source is configured to supply a controlled amount of electric voltage between the first terminal 405A and the second terminal 405B.

The device 400 also includes measurement circuitry 407 having the first input terminal 407A and the second input terminal 407B. The first input terminal 407A of the measurement circuitry 407 is electrically connected to a first selected one of the multiple conductive pads 401. The second input terminal 407B of the measurement circuitry 407 is electrically connected to a second selected one of the multiple conductive pads 401. The measurement circuitry 407 is configured to determine a value of an electrical parameter based on electrical signals present at the first and second selected ones of the multiple conductive pads 401. In some embodiments, the measurement circuitry 407 is configured to measure one or both of an electric voltage and an electric current based on the electrical signals present at the first and second selected ones of the multiple conductive pads 401. In some embodiments, the measurement circuitry 407 is configured to measure an electric voltage based on a first measurement signal present at the first input terminal 407A and a second measurement signal present at the second input terminal 407B. In some embodiments, the measurement circuitry 407 is configured to measure an electric current based on a first measurement signal present at the first input terminal 407A and a second measurement signal present at the second input terminal 407B.

The device 400 includes switching circuitry 409 configured to connect the first terminal 405A of the electrical power source 405 to a first selected one of the multiple conductive pads 401 at a given time. The switching circuitry 409 is also configured to connect the second terminal 405B of the electrical power source 405 to a second selected one of the multiple conductive pads 401 at the given time. The switching circuitry 409 is also configured to connect the first input terminal 407A of the measurement circuitry 407 to the first selected one of the multiple conductive pads 401 at the given time. And, the switching circuitry 409 is configured to connect the second input terminal 407B of the measurement circuitry 407 to the second selected one of the multiple conductive pads 401 at the given time. The device 400 also includes the power supply 415 disposed on the disc-shaped structure. The power supply 415 is connected to supply electric power to all electric powered components of the device 400 on board the disc-shaped structure. In some embodiments, the power supply 415 is a battery.

In some embodiments, the device 400 includes the control module 411 disposed on the disc-shaped structure. The control module 411 is configured to direct operation of the electrical power source 405 and the measurement circuitry 407 and the switching circuitry 409. In some embodiments, the control module 411 is configured to direct the switching circuitry 409 to connect a particular one or more of the multiple conductive pads 401 to the first terminal 405A of the electrical power source 405 at a given time. And, in some embodiments, the control module 411 is configured to direct the switching circuitry 409 to connect a particular one or more of the multiple conductive pads 401 to the second terminal 405B of the electrical power source 405 at the given time. In some embodiments, the switching circuitry 409 is operated to ensure that the one or more of the multiple conductive pads 401 electrically connected to the second terminal 405B of the electrical power source 405 at the given time are different than the one or more of the multiple conductive pads 401 electrically connected to the first terminal 405A of the electrical power source 405 at the given time, so as to avoid an electrical short between the first terminal 405A and second terminal 405B of the electrical power source 405.

In some embodiments, the switching circuitry 409 is configured to selectively electrically connect any two or more of the multiple conductive pads 401 to the first input terminal 407A of the measurement circuitry 407 at a given time. Also, in some embodiments, the switching circuitry 409 is configured to selectively electrically connect any two or more of the multiple conductive pads 401 to the second input terminal 407B of the measurement circuitry 407 at the given time. In some embodiments, the switching circuitry 409 is operated to ensure that the two or more of the multiple conductive pads 401 electrically connected to the second input terminal 407B of the measurement circuitry 407 at the given time are different than the two or more of the multiple conductive pads 401 electrically connected to the first input terminal 407A of the measurement circuitry 407 at the given time.

In some embodiments, the device 400 is configured to have the memory module 413 defined as a computer memory onboard the disc-shaped structure. The computer memory is configured to store digital data representing the value of the electrical parameter as determined by the measurement circuitry 407. Also, in some embodiments, the measurement circuitry 407 includes analog-to-digital conversion circuitry for converting the value of the electrical parameter into digital data representing the value of the electrical parameter. Also, in some embodiments, the device 400 is configured to include the communication module 417 disposed onboard the disc-shaped structure. In some embodiments, the communication module 417 is configured to wirelessly communicate data representing the value of the electrical parameter determined by the measurement circuitry 407.

In some embodiments, the control module 411 disposed onboard the disc-shaped structure of the device 400 is configured to direct operation of the electrical power source 405, the measurement circuitry 407, the switching circuitry 409, the power supply 415, the memory module 413, and the communication module 417. In some embodiments, the control module 411 is configured to direct the switching circuitry 409 to connect a particular one or more of the multiple conductive pads 401 to the first terminal 405A of the electrical power source 405 at the given time, and to connect a particular one or more of the multiple conductive pads 401 to the second terminal 405B of the electrical power source 405 at the given time, and to connect a particular one or more of the multiple conductive pads 401 to the first input terminal 407A of the measurement circuitry 407 at the given time, and to connect a particular one or more of the multiple conductive pads 401 to the second input terminal 407B of the measurement circuitry 407 at the given time.

Figure 8:
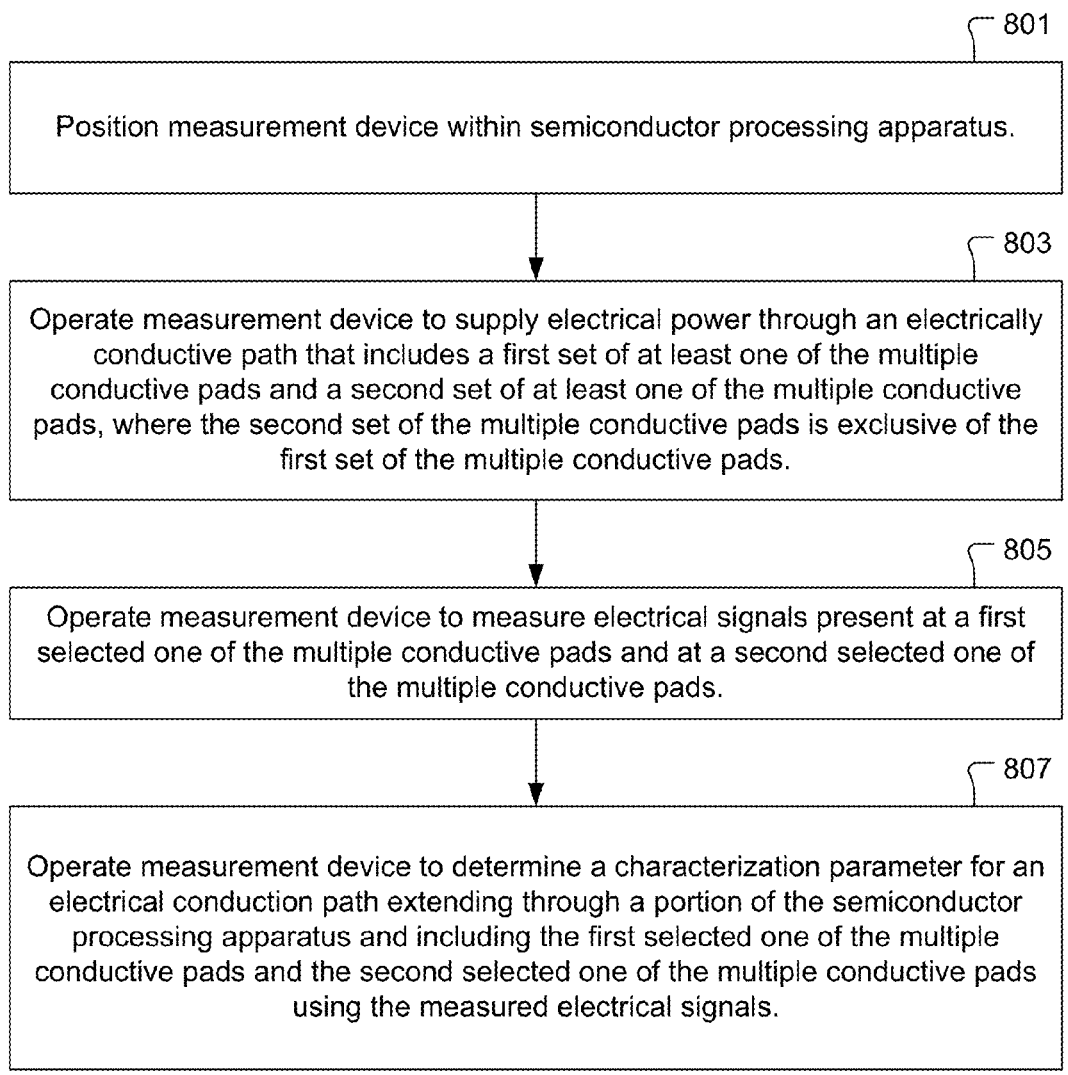
FIG. 8 shows a flowchart of a method for measuring electrical properties of electrical contacts within an electroplating apparatus, in accordance with some embodiments of the present invention.

FIG. 8 shows a flowchart of a method for measuring electrical properties of electrical conduction paths within a semiconductor processing apparatus, such as the electroplating apparatus 100, among others, in accordance with some embodiments of the present invention. The semiconductor processing apparatus is configured to electrically connect the electrical conduction paths to a surface of the wafer 109 when performing a process on the wafer 109. The method includes an operation 801 for positioning the measurement device 400 within the semiconductor processing apparatus. The measurement device 400 has a disc-shaped structure with an outer diameter substantially equal to an outer diameter of the wafer 109 and with an overall thickness substantially similar to an overall thickness of the wafer 109. The measurement device 400 is positioned within the semiconductor processing apparatus such that multiple conductive pads 401 formed along an outer perimeter of a first side of the measurement device 400 physically contact electrical contacts 107 within the semiconductor processing apparatus. Adjacently positioned ones of the multiple conductive pads 401 are electrically isolated from each other on the measurement device 400. And, the multiple conductive pads 401 collectively circumscribe the outer perimeter of the first side of the measurement device 400.

The method also includes an operation 803 for operating the measurement device 400 to supply electrical power through an electrically conductive path that includes a first set of at least one of the multiple conductive pads 401 and a second set of at least one of the multiple conductive pads 401, where the second set of the multiple conductive pads 401 is exclusive of the first set of the multiple conductive pads 401. The method also includes an operation 805 for operating the measurement device 400 to measure electrical signals present at a first selected one of the multiple conductive pads 401 and at a second selected one of the multiple conductive pads 401.

The method also includes an operation 807 for operating the measurement device 400 to determine a characterization parameter for an electrical conduction path extending through a portion of the semiconductor processing apparatus and including the first selected one of the multiple conductive pads 401 and the second selected one of the multiple conductive pads 401 using the measured electrical signals. The method can also include operating the measurement device 400 to communicate (in either a wireless and/or wired manner) and/or store data representing the value of the characterization parameter for the electrical conduction path.

In some embodiments, the characterization parameter for the electrical conduction path extending through the portion of the semiconductor processing apparatus is an electrical resistance value. For example, in the electroplating apparatus 100 embodiment, the electrical conduction paths within the semiconductor processing apparatus (electroplating apparatus 100) can include electrical contacts 107 in physical contact with the multiple conductive pads 401 when the measurement device 400 is positioned within the semiconductor processing apparatus (electroplating apparatus 100). More specifically, the electrical resistance value includes an electrical resistance of the electrical contacts 107 in physical contact with the first selected one of the multiple conductive pads 401 and an electrical resistance of the electrical contacts 107 in physical contact with the second selected one of the multiple conductive pads 401. And, the electrical resistance value can include an electrical resistance through a section of the lip seal member 105 extending from the first selected one of the multiple conductive pads 401 to the second selected one of the multiple conductive pads 401. Also, the electrical resistance value can include an electrical resistance through a section of the bus bar 115 extending from the first selected one of the multiple conductive pads 401 to the second selected one of the multiple conductive pads 401. Also, the electrical resistance value can include an electrical resistance through a section of the conductive strip 107A extending from the first selected one of the multiple conductive pads 401 to the second selected one of the multiple conductive pads 401.

In some embodiments, operation 803 for operating the measurement device 400 to supply electrical power through the electrically conductive path includes transmitting electrical current through the first set of at least one of the multiple conductive pads 401 and the second set of at least one of the multiple conductive pads 401. It should be understood that in various embodiments the method can include operating the measurement device 400 to supply electric current to a plurality of the multiple conductive pads 401 at a given time, or to sink electric current from a plurality of the multiple conductive pads 401 at a given time, or to both supply electric current to a plurality of the multiple conductive pads 401 at a given time and sink electric current from a different plurality of the multiple conductive pads 401 at the given time. Also, in some embodiments, operation 803 for operating the measurement device 400 to supply electrical power through the electrically conductive path includes applying a voltage differential between the first set of at least one of the multiple conductive pads 401 and the second set of at least one of the multiple conductive pads 401.

Additionally, in view of the foregoing, it should be understood that a system is disclosed herein for measuring electrical properties of electrical conduction paths within a semiconductor processing apparatus, such as the electroplating apparatus 100, among others, where the semiconductor processing apparatus is configured to electrically connect the electrical conduction paths to a surface of the wafer 109 when performing a process on the wafer 109. The system includes the measurement device 400 having a disc-shaped structure with an outer diameter substantially equal to an outer diameter of the wafer 109 and with an overall thickness substantially similar to an overall thickness of the wafer 109. The measurement device 400 includes multiple conductive pads 401 formed along an outer perimeter of a first side of the disc-shaped structure. Adjacently positioned ones of the multiple conductive pads 401 are electrically isolated from each other. And, the multiple conductive pads 401 collectively circumscribe the outer perimeter of the first side of the disc-shaped structure.

The measurement device 400 includes the electrical power source 405 having the first terminal 405A and the second terminal 405B. The electrical power source 405 is configured to supply electrical power through an electrically conductive path extending between the first terminal 405A and the second terminal 405B and through a portion of the semiconductor processing apparatus when the measurement device 400 is positioned within the semiconductor processing apparatus. The first terminal 405A is electrically connected to a first set of at least one of the multiple conductive pads 401. The second terminal is electrically connected to a second set of at least one of the multiple conductive pads 401. The second set of the multiple conductive pads 401 is exclusive of the first set of the multiple conductive pads 401. The first and second sets of the multiple conductive pads 401 form part of the electrically conductive path extending between the first terminal 405A and the second terminal 405B. The measurement device 400 includes the measurement circuitry 407 having the first input terminal 407A and the second input terminal 407B. The first input terminal 407A of the measurement circuitry 407 is electrically connected to a first selected one of the multiple conductive pads 401. The second input terminal 407B of the measurement circuitry 407 is electrically connected to a second selected one of the multiple conductive pads 401. The measurement circuitry 407 is configured to determine a value of an electrical parameter based on electrical signals present at the first and second selected ones of the multiple conductive pads 401.

The measurement device 400 includes switching circuitry 409 configured to connect the first terminal 405A of the electrical power source 405 to a first set of at least one of the multiple conductive pads 401 at a given time. The switching circuitry 409 is configured to connect the second terminal 405B of the electrical power source 405 to a second set of at least one of the multiple conductive pads 401 at the given time. The switching circuitry 409 is configured to connect the first input terminal 407A of the measurement circuitry 407 to the first selected one of the multiple conductive pads 401 at the given time. And, the switching circuitry 409 is configured to connect the second input terminal 407B of the measurement circuitry 407 to the second selected one of the multiple conductive pads 401 at the given time.

The measurement device 400 also includes a communication module 417 configured to communicate data (in a wireless and/or wired manner) representing the value of the electrical parameter determined by the measurement circuitry 407. The measurement device 400 also includes a power supply 415 connected to supply electric power to all electric powered components on the measurement device 400. Additionally, the system includes a computer system associated with the electroplating apparatus 100. The computer system is configured to receive the communicated data from the communication module 417 of the measurement device 400. Also, the measurement device 400 can include a data storage device, such as the memory module 413, configured to store the value of the electrical parameter determined based on electrical signals present at the first and second selected ones of the multiple conductive pads 401.

Figure 9:
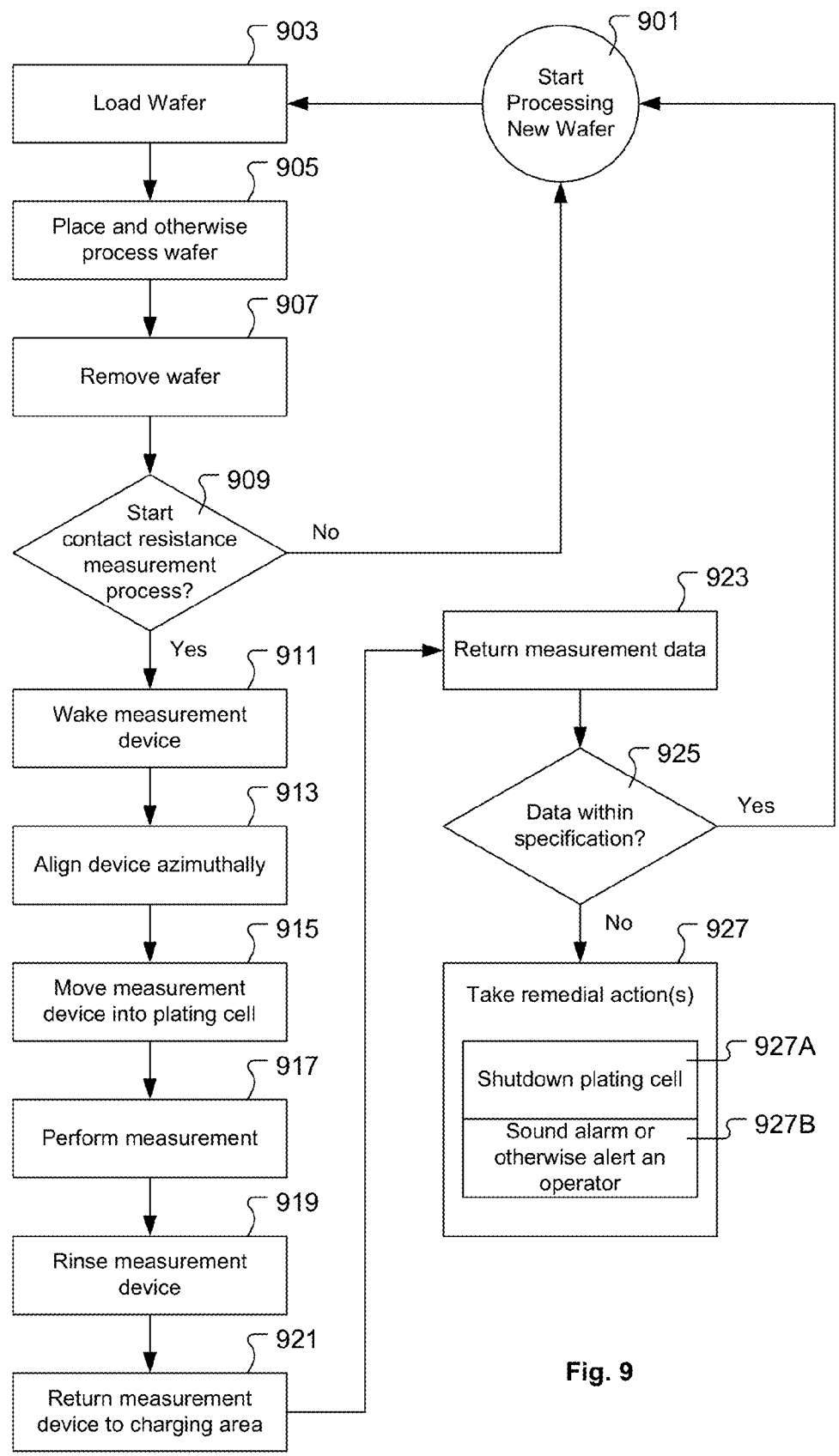
FIG. 9 shows a flowchart of a method for operating the electroplating apparatus to implement an automated electroplating cell assessment, in accordance with some embodiments of the present invention.

FIG. 9 shows a flowchart of a method for operating the electroplating apparatus 100 to implement an automated electroplating cell assessment, in accordance with some embodiments of the present invention. The method includes an operation 901 for starting an electroplating process on a new wafer 109. From the operation 901, the method proceeds with an operation 903 to load the wafer 109 into the electroplating apparatus 100. From the operation 903, the method proceeds with an operation 905 to perform the electroplating process on the wafer 109. From the operation 905, the method proceeds with an operation 907 to remove the wafer 109 from the electroplating apparatus 100. After the operation 907 to remove the wafer 109 from the electroplating apparatus 100, a decision operation 909 is performed to determine whether or not a measurement process is to be performed on the finger contacts 107. If no measurement process is to be performed, the method reverts back to the operation 901 to start an electroplating process on a new wafer 109.

If the measurement process is to be performed on the finger contacts 107, the method proceeds from the operation 909 to an operation 911 for waking up the measurement device 400. From the operation 911, the method proceeds with an operation 913 for aligning the measurement device 400 azimuthally. The azimuthal alignment of the measurement device 400 can be performed in a standard wafer aligner device. From the operation 913, the method proceeds with an operation 915 for moving the measurement device 400 into the electroplating apparatus 100, such that the measurement device 400 is positioned to have the conductive pads 401 in physical contact with the finger contacts 107. From the operation 915, the method proceeds with an operation 917 in which the measurement device 400 is operated to perform measurements of the electrical parameters of the finger contacts 107 and/or lip seal member 105.

From the operation 917, the method proceeds with an operation 919 to rinse the measurement device 400. Then, an operation 921 is performed to return the measurement device 400 to its storage location. At the storage location the power supply 415 of the measurement device 400 can be recharged if needed. In some embodiments, the power supply 415 is configured to receive an inductive charge so that external contacts are not required to charge the power supply 415. However, in some embodiments, the measurement device 400 is equipped with external contacts for connection to a power source at the storage location to provide for charging of the power supply 415.

Once the measurement device 400 is returned to its storage location, the method proceeds with an operation 923 to communicate the measurement data taken by the measurement device 400 to a computer system associated with the electroplating apparatus 100. The method includes an operation 925 to determine whether or not the electrical parameter data measured by the measurement device 400 is within acceptable limits. If the electrical parameter data is determined to be within acceptable limits, the method reverts back to the operation 901 to start an electroplating process on a new wafer 109. If the electrical parameter data is determined to not be within acceptable limits, the method proceeds with an operation 927 to initiate taking of some remedial action to fix the electroplating apparatus 100. In some embodiments, the operation 927 can include an operation 927A for shutting down the electroplating apparatus 100. And, in some embodiments, the operation 927 can include an operation 927B for sounding an alarm or otherwise alerting an operator within the fabrication facility to the adverse condition of the electroplating apparatus 100.

Figure 10:
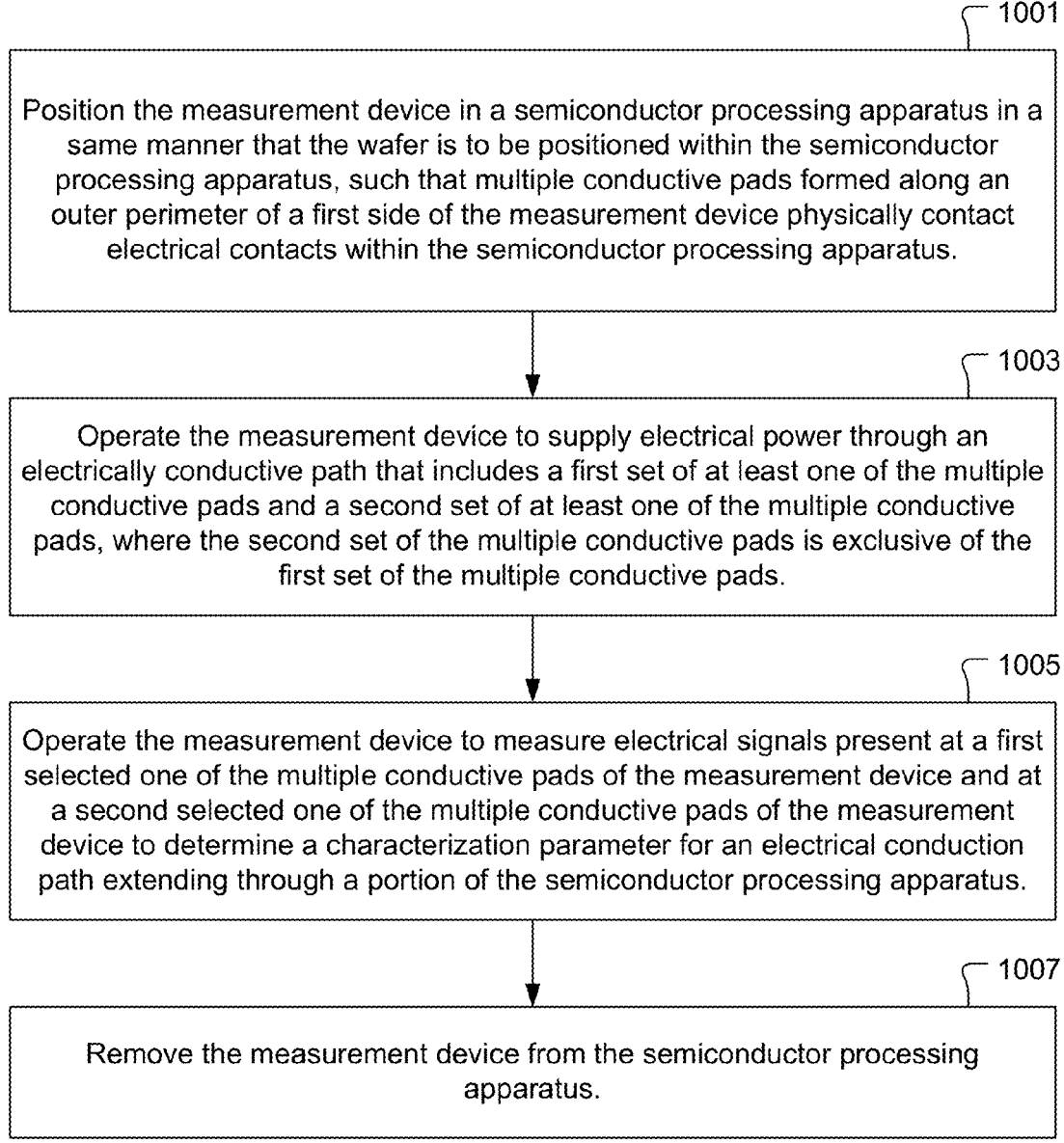
FIG. 10 shows a flowchart of a method for assessing a condition of a semiconductor processing apparatus, in accordance with some embodiments of the present invention.

FIG. 10 shows a flowchart of a method for assessing a condition of a semiconductor processing apparatus, in accordance with some embodiments of the present invention. The method includes an operation 1001 for positioning the measurement device 400 in a semiconductor processing apparatus in a same manner that the wafer 109 is to be positioned within the semiconductor processing apparatus. The semiconductor processing apparatus is configured to electrically connect one or more electrical conduction paths to a surface of the wafer 109 when performing a process on the wafer 109. The measurement device 400 has a disc-shaped structure with an outer diameter substantially equal to an outer diameter of the wafer 109 and with an overall thickness substantially similar to an overall thickness of the wafer 109. The measurement device 400 is positioned within the semiconductor processing apparatus such that the multiple conductive pads 401 formed along an outer perimeter of the first side of the measurement device 400 physically contact electrical contacts within the semiconductor processing apparatus. The method also includes an operation 1003 for operating the measurement device 400 to supply electrical power through an electrically conductive path that includes a first set of at least one of the multiple conductive pads and a second set of at least one of the multiple conductive pads, where the second set of the multiple conductive pads is exclusive of the first set of the multiple conductive pads.

The method also includes an operation 1005 for operating the measurement device 400 to measure electrical signals present at a first selected one of the multiple conductive pads 401 and at a second selected one of the multiple conductive pads 401 to determine a characterization parameter for an electrical conduction path extending through a portion of the semiconductor processing apparatus. The method also includes an operation 1007 for removing the measurement device 400 from the semiconductor processing apparatus.

The method of FIG. 10 can also include an operation for determining whether or not the characterization parameter for the electrical conduction path is acceptable. And, upon determining that the characterization parameter for the electrical conduction path is not acceptable, the method can include an operation for providing a notification that the semiconductor processing apparatus requires servicing. And, upon determining that the characterization parameter for the electrical conduction path is acceptable, the method can include an operation for continuing with normal operation of the semiconductor processing apparatus. The method can also include storing the measurement device 400 at the semiconductor processing apparatus. Additionally, the method can include charging the measurement device 400 when stored at the semiconductor processing apparatus.

It should be appreciated that the measurement device 400 disclosed herein can be operated remotely and autonomously without requiring user interaction with the measurement device 400. Also, the measurement device 400 provides for monitoring of electroplating apparatus 100 components and transferring of measurement data without user interaction. And, the measurement device 400 disclosed herein can be placed in the electroplating apparatus 100 by robot in the same manner as a wafer, and can wirelessly report results back to the electroplating tool and/or other control system. Using the measurement device 400, measurements of electrical parameters of the finger contacts 107 and/or lip seal member 105 can be scheduled into the normal operating schedule of the electroplating apparatus 100.

Also, the measurement device 400 disclosed herein does not require electrical separation of either the conductive strip 107A or of the bus bar 115 into segments in order to analyze the electrical resistance through specific azimuthal segments of the finger contacts 107 and/or lip seal member 105. The measurement device 400 provides for measurement of electrical parameters of discrete components that are electrically at the same potential. The measurement device 400 provides for selection of a particular azimuthal section of the finger contacts 107 and lip seal member 105 for electrical resistance measurement. And, because the measurement device 400 does not require disassembly of the bus bar 115 or any other component of the electroplating apparatus 100 in order to perform measurement of the electrical resistance present at any given azimuthal segment of the finger contacts 107 and/or lip seal member 105, it is not necessary to take the electroplating apparatus 100 out of service to assess the condition of the finger contacts 107 and/or lip seal member 105, thereby providing for an improvement in availability of the electroplating apparatus 100 and corresponding improvement in the throughput of the fabrication facility.

Conventional electroplating apparatus inspection methods rely upon visual inspection to identify evidence of gross electroplating solution leaks due to lip seal member 105 failure and to assess the appearance of the finger contacts 107 to check for plating on the finger contacts 107. Therefore, conventional inspection methods are qualitative in nature. In contrast to these convention inspection methods, it should be understood that the measurement device 400 disclosed herein provides for quantitative measurement of electrical parameters of electroplating cell components, such as the finger contacts 107 and the lip seal member 105. Additionally, the measurement device 400 can provide for monitoring of aging and gross failure of electroplating apparatus 100 components that are not monitored using conventional inspection methods.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A device for measuring electrical properties of electrical conduction paths within a semiconductor processing apparatus, the semiconductor processing apparatus configured to electrically connect the electrical conduction paths to a surface of a wafer when performing a process on the wafer, comprising:
a disc-shaped structure having an outer diameter substantially equal to an outer diameter of the wafer, the disc-shaped structure having an overall thickness substantially similar to an overall thickness of the wafer;
multiple conductive pads formed along an outer perimeter of a first side of the disc-shaped structure, wherein adjacently positioned ones of the multiple conductive pads are electrically isolated from each other, and wherein the multiple conductive pads collectively circumscribe the outer perimeter of the first side of the disc-shaped structure;
an electrical power source having a first terminal and a second terminal, the electrical power source configured to supply electrical power through an electrically conductive path extending between the first terminal and the second terminal and through a portion of the semiconductor processing apparatus when the disc-shaped structure is positioned within the semiconductor processing apparatus, the first terminal electrically connected to a first set of at least one of the multiple conductive pads, the second terminal electrically connected to a second set of at least one of the multiple conductive pads, the second set of the multiple conductive pads exclusive of the first set of the multiple conductive pads, the first and second sets of the multiple conductive pads forming part of the electrically conductive path extending between the first terminal and the second terminal;
measurement circuitry having a first input terminal and a second input terminal, the first input terminal of the measurement circuitry electrically connected to a first selected one of the multiple conductive pads, the second input terminal of the measurement circuitry electrically connected to a second selected one of the multiple conductive pads, the measurement circuitry configured to determine a value of an electrical parameter based on electrical signals present at the first and second selected ones of the multiple conductive pads; and
a power supply disposed on the disc-shaped structure, the power supply connected to supply electric power to all electric powered components on the disc-shaped structure.

2. The device as recited in claim 1, wherein the disc-shaped structure is a printed circuit board.

3. The device as recited in claim 1, wherein the disc-shaped structure is formed of an electrical insulating material, and wherein adjacently positioned ones of the multiple conductive pads are separated from each other by a portion of the disc-shaped structure.

4. The device as recited in claim 1, wherein electrical isolation structures are disposed on the disc-shaped structure to electrically isolate adjacently positioned ones of the multiple conductive pads from each other.

5. The device as recited in claim 1, wherein each of the multiple conductive pads has a substantially equal size as measured along the outer perimeter of the first side of the disc-shaped structure.

6. The device as recited in claim 1, wherein the measurement circuitry is configured to measure one or both of an electric voltage and an electric current based on the electrical signals present at the first and second selected ones of the multiple conductive pads.

7. The device as recited in claim 1, wherein the electrical power source is configured to supply a controlled amount of electric current through the electrically conductive path extending between the first terminal and the second terminal.

8. The device as recited in claim 1, wherein the electrical power source is configured to supply a controlled amount of electric voltage between the first terminal and the second terminal.

9. The device as recited in claim 1, further comprising:
switching circuitry configured to connect the first terminal of the electrical power source to the first set of at least one of the multiple conductive pads at a given time, the switching circuitry configured to connect the second terminal of the electrical power source to the second set of at least one of the multiple conductive pads at the given time, the switching circuitry configured to connect the first input terminal of the measurement circuitry to the first selected one of the multiple conductive pads at the given time, and the switching circuitry configured to connect the second input terminal of the measurement circuitry to the second selected one of the multiple conductive pads at the given time.

10. The device as recited in claim 9, wherein the switching circuitry is configured to selectively electrically connect any two or more of the multiple conductive pads to the first input terminal of the measurement circuitry at the given time.

11. The device as recited in claim 10, wherein the switching circuitry is configured to selectively electrically connect any two or more of the multiple conductive pads to the second input terminal of the measurement circuitry at the given time, wherein the two or more of the multiple conductive pads electrically connected to the second input terminal of the measurement circuitry at the given time are different than the two or more of the multiple conductive pads electrically connected to the first input terminal of the measurement circuitry at the given time.

12. The device as recited in claim 9, further comprising:
a control module disposed on the disc-shaped structure, the control module configured to direct operation of the electrical power source and the measurement circuitry and the switching circuitry.

13. The device as recited in claim 12, wherein the control module is configured to direct the switching circuitry to connect a particular one or more of the multiple conductive pads to the first terminal of the electrical power source at the given time, and to connect a particular one or more of the multiple conductive pads to the second terminal of the electrical power source at the given time, and to connect a particular one or more of the multiple conductive pads to the first input terminal of the measurement circuitry at the given time, and to connect a particular one or more of the multiple conductive pads to the second input terminal of the measurement circuitry at the given time.

14. The device as recited in claim 1, further comprising:
a computer memory disposed on the disc-shaped structure, the computer memory configured to store digital data representing the value of the electrical parameter as determined by the measurement circuitry, wherein the measurement circuitry includes analog-to-digital conversion circuitry for converting the value of the electrical parameter into digital data representing the value of the electrical parameter.

15. The device as recited in claim 1, further comprising:
a communication module disposed on the disc-shaped structure, the communication module configured to wirelessly communicate data representing the value of the electrical parameter determined by the measurement circuitry.

16. The device as recited in claim 1, wherein the semiconductor processing apparatus is an electroplating apparatus, and wherein the electrical conduction paths within the semiconductor processing apparatus include electrical contacts configured to physically contact the multiple conductive pads formed along the outer perimeter of the first side of the disc-shaped structure when the disc-shaped structure is positioned within the semiconductor processing apparatus.

17. A method for measuring electrical properties of electrical conduction paths within a semiconductor processing apparatus, the semiconductor processing apparatus configured to electrically connect the electrical conduction paths to a surface of a wafer when performing a process on the wafer, comprising:
positioning a measurement device within the semiconductor processing apparatus, the measurement device having a disc-shaped structure with an outer diameter substantially equal to an outer diameter of the wafer and with an overall thickness substantially similar to an overall thickness of the wafer, wherein the measurement device is positioned within the semiconductor processing apparatus such that multiple conductive pads formed along an outer perimeter of a first side of the measurement device physically contact electrical contacts within the semiconductor processing apparatus, wherein adjacently positioned ones of the multiple conductive pads are electrically isolated from each other on the measurement device, and wherein the multiple conductive pads collectively circumscribe the outer perimeter of the first side of the measurement device;
operating the measurement device to supply electrical power through an electrically conductive path that includes a first set of at least one of the multiple conductive pads and a second set of at least one of the multiple conductive pads, wherein the second set of the multiple conductive pads is exclusive of the first set of the multiple conductive pads;
operating the measurement device to measure electrical signals present at a first selected one of the multiple conductive pads and at a second selected one of the multiple conductive pads; and
operating the measurement device to determine a characterization parameter for an electrical conduction path extending through a portion of the semiconductor processing apparatus and including the first selected one of the multiple conductive pads and the second selected one of the multiple conductive pads using the measured electrical signals.

18. The method as recited in claim 17, wherein the characterization parameter for the electrical conduction path extending through the portion of the semiconductor processing apparatus is an electrical resistance value.

19. The method as recited in claim 18, wherein the semiconductor processing apparatus is an electroplating apparatus, and wherein the electrical conduction paths within the semiconductor processing apparatus include electrical contacts in physical contact with the multiple conductive pads when the measurement device is positioned within the semiconductor processing apparatus.

20. The method as recited in claim 17, wherein operating the measurement device to supply electrical power through the electrically conductive path includes transmitting electrical current through the first set of at least one of the multiple conductive pads and the second set of at least one of the multiple conductive pads.

21. The method as recited in claim 17, wherein operating the measurement device to supply electrical power through the electrically conductive path includes applying a voltage differential between the first set of at least one of the multiple conductive pads and the second set of at least one of the multiple conductive pads.

22. The method as recited in claim 17, further comprising:
operating the measurement device to store data representing the value of the characterization parameter for the electrical conduction path.

23. A system for measuring electrical properties of electrical conduction paths within a semiconductor processing apparatus, the semiconductor processing apparatus configured to electrically connect the electrical conduction paths to a surface of a wafer when performing a process on the wafer, comprising:
a measurement device having a disc-shaped structure with an outer diameter substantially equal to an outer diameter of the wafer and with an overall thickness substantially similar to an overall thickness of the wafer,
the measurement device including multiple conductive pads formed along an outer perimeter of a first side of the disc-shaped structure, wherein adjacently positioned ones of the multiple conductive pads are electrically isolated from each other, and wherein the multiple conductive pads collectively circumscribe the outer perimeter of the first side of the disc-shaped structure,
the measurement device including an electrical power source having a first terminal and a second terminal, the electrical power source configured to supply electrical power through an electrically conductive path extending between the first terminal and the second terminal and through a portion of the semiconductor processing apparatus when the measurement device is positioned within the semiconductor processing apparatus, the first terminal electrically connected to a first set of at least one of the multiple conductive pads, the second terminal electrically connected to a second set of at least one of the multiple conductive pads, the second set of the multiple conductive pads exclusive of the first set of the multiple conductive pads, the first and second sets of the multiple conductive pads forming part of the electrically conductive path extending between the first terminal and the second terminal, the measurement device including measurement circuitry having a first input terminal and a second input terminal, the first input terminal of the measurement circuitry electrically connected to a first selected one of the multiple conductive pads, the second input terminal of the measurement circuitry electrically connected to a second selected one of the multiple conductive pads, the measurement circuitry configured to determine a value of an electrical parameter based on electrical signals present at the first and second selected ones of the multiple conductive pads, the measurement device including a communication module configured to communicate data representing the value of the electrical parameter determined by the measurement circuitry, and the measurement device including a power supply connected to supply electric power to all electric powered components on the measurement device.

24. The system as recited in claim 23, wherein the measurement device includes switching circuitry configured to connect the first terminal of the electrical power source to the first set of at least one of the multiple conductive pads at a given time, the switching circuitry configured to connect the second terminal of the electrical power source to the second set of at least one of the multiple conductive pads at the given time, the switching circuitry configured to connect the first input terminal of the measurement circuitry to the first selected one of the multiple conductive pads at the given time, and the switching circuitry configured to connect the second input terminal of the measurement circuitry to the second selected one of the multiple conductive pads at the given time.

25. The system as recited in claim 23, wherein the measurement device includes a data storage device configured to store the value of the electrical parameter determined based on electrical signals present at the first and second selected ones of the multiple conductive pads.

26. A method, comprising:
positioning a measurement device in a semiconductor processing apparatus in a same manner that a wafer is to be positioned within the semiconductor processing apparatus, the semiconductor processing apparatus configured to electrically connect one or more electrical conduction paths to a surface of the wafer when performing a process on the wafer, the measurement device having a disc-shaped structure with an outer diameter substantially equal to an outer diameter of the wafer and with an overall thickness substantially similar to an overall thickness of the wafer, wherein the measurement device is positioned within the semiconductor processing apparatus such that multiple conductive pads formed along an outer perimeter of a first side of the measurement device physically contact electrical contacts within the semiconductor processing apparatus;

operating the measurement device to supply electrical power through an electrically conductive path that includes a first set of at least one of the multiple conductive pads and a second set of at least one of the multiple conductive pads, wherein the second set of the multiple conductive pads is exclusive of the first set of the multiple conductive pads;

operating the measurement device to measure electrical signals present at a first selected one of the multiple conductive pads and at a second selected one of the multiple conductive pads to determine a characterization parameter for an electrical conduction path extending through a portion of the semiconductor processing apparatus; and removing measurement device from semiconductor processing apparatus.

27. The method as recited in claim 26, further comprising:
determining whether or not the characterization parameter for the electrical conduction path is acceptable;
upon determining that the characterization parameter for the electrical conduction path is not acceptable, providing a notification that the semiconductor processing apparatus requires servicing; and
upon determining that the characterization parameter for the electrical conduction path is acceptable, continuing with normal operation of the semiconductor processing apparatus.

28. The method as recited in claim 26, further comprising:
storing the measurement device at the semiconductor processing apparatus.

29. The method as recited in claim 28, further comprising:
charging the measurement device when stored at the semiconductor processing apparatus.

* * * * *